United States Patent
Lee et al.

(10) Patent No.: US 11,100,962 B2
(45) Date of Patent: Aug. 24, 2021

(54) SEMICONDUCTOR DEVICE WITH A POWER-DOWN MODE AND A POWER GATING CIRCUIT AND SEMICONDUCTOR SYSTEM INCLUDING THE SAME

(71) Applicant: SK hynix Inc., Icheon-si (KR)

(72) Inventors: Yoo Jong Lee, Suwon-si (KR); Sang Sic Yoon, Yongin-si (KR)

(73) Assignee: SK hynix Inc., Icheon-si (KR)

( * ) Notice: Subject to any disclaimer, the term of this patent is extended or adjusted under 35 U.S.C. 154(b) by 0 days.

(21) Appl. No.: 16/943,874

(22) Filed: Jul. 30, 2020

(65) Prior Publication Data
US 2020/0357445 A1    Nov. 12, 2020

Related U.S. Application Data

(63) Continuation-in-part of application No. 16/232,205, filed on Dec. 26, 2018, now Pat. No. 10,943,626.

(60) Provisional application No. 62/610,452, filed on Dec. 26, 2017.

(51) Int. Cl.
G11C 5/14    (2006.01)
(52) U.S. Cl.
CPC .................................. *G11C 5/148* (2013.01)
(58) Field of Classification Search
None
See application file for complete search history.

(56) References Cited

U.S. PATENT DOCUMENTS

| | | | |
|---|---|---|---|
| 4,962,487 A * | 10/1990 | Suzuki | G06F 1/32 365/189.11 |
| 10,042,587 B1 * | 8/2018 | Pedersen | G11C 7/20 |
| 10,943,626 B1 * | 3/2021 | Kim | G11C 7/1096 |
| 2004/0027902 A1 | 2/2004 | Ooishi et al. | |
| 2004/0151050 A1 | 8/2004 | Ooishi | |
| 2005/0052931 A1 * | 3/2005 | Hardee | G11C 7/065 365/223 |
| 2005/0052936 A1 * | 3/2005 | Hardee | G11C 7/1096 365/230.06 |
| 2005/0270074 A1 * | 12/2005 | Hardee | G11C 7/1096 327/112 |
| 2005/0286339 A1 | 12/2005 | Parris et al. | |
| 2007/0201295 A1 | 8/2007 | Lines | |
| 2009/0129192 A1 | 5/2009 | Barth, Jr. et al. | |

(Continued)

FOREIGN PATENT DOCUMENTS

KR    101716965 B1    3/2017
KR    101914296 B1    11/2018

*Primary Examiner* — J. H. Hur
(74) *Attorney, Agent, or Firm* — William Park & Associates Ltd.

(57) ABSTRACT

A semiconductor device includes a power gating control block and a power gating circuit. The power gating control block activates a data power control signal during a period that is set by a target code, the period being from a point in time in which the semiconductor device enters a read mode or a write mode. In addition, the power gating control block deactivates an operation power control signal in a power-down mode. The power gating circuit inhibits a data power signal from being supplied to a data input/output block based on the data power control signal. Moreover, the power gating control block inhibits an operation power signal from being supplied to an internal operation control block based on the operation power control signal.

20 Claims, 21 Drawing Sheets

(56) References Cited

U.S. PATENT DOCUMENTS

| | | |
|---|---|---|
| 2012/0033521 A1 | 2/2012 | Nakamura et al. |
| 2012/0286850 A1 | 11/2012 | Myers et al. |
| 2012/0287712 A1 | 11/2012 | Murakami |
| 2013/0120045 A1 | 5/2013 | Hegde |
| 2013/0141988 A1 | 6/2013 | McCombs et al. |
| 2013/0290753 A1 | 10/2013 | Ramaraju et al. |
| 2014/0003181 A1* | 1/2014 | Wang .................... G11C 11/413 |
| | | 365/226 |
| 2017/0194041 A1 | 7/2017 | Kim et al. |
| 2018/0203643 A1* | 7/2018 | Pedersen ............... G06F 3/0659 |
| 2018/0366422 A1 | 12/2018 | Matsubara |
| 2019/0050048 A1* | 2/2019 | Kang .................... G06F 1/3275 |
| 2019/0304530 A1 | 10/2019 | Choi |

* cited by examiner

SEMICONDUCTOR DEVICE WITH A POWER-DOWN MODE AND A POWER GATING CIRCUIT AND SEMICONDUCTOR SYSTEM INCLUDING THE SAME

CROSS-REFERENCE TO RELATED APPLICATION

This application is a continuation-in-part of U.S. patent application Ser. No. 16/232,205, filed on Dec. 26, 2018, which claims the priority under 35 U.S.C. § 119 to U.S. Provisional Patent Application No. 62/610,452, filed on Dec. 26, 2017.

BACKGROUND

1. Field

Various embodiments of the present invention relate to a semiconductor design technique, and more particularly, to a semiconductor device including a power gating circuit and a semiconductor system including the semiconductor device.

2. Description of the Related Art

Semiconductor devices should be designed to minimize unnecessary power consumption such as standby power. In particular, because many portable devices use batteries, which are of limited power supply, power consumption is an important design issue.

SUMMARY

According to an embodiment, a semiconductor device includes a power gating control block and a power gating circuit. The power gating control block is configured to activate a data power control signal during a period that is set by a target code, the period being from a point in time in which the semiconductor device enters a read mode or a write mode. The power gating control block is configured to deactivate an operation power control signal in a power-down mode. The power gating circuit is configured to inhibit a data power signal from being supplied to a data input/output block based on the data power control signal. The power gating circuit is configured to inhibit an operation power signal from being supplied to an internal operation control block based on the operation power control signal.

According to another embodiment, a semiconductor device includes a power gating control block, a data power driving circuit, and an operation power driving circuit. The power gating control block is configured to generate a data power control signal based on a write mode signal, a read mode signal, a write latency signal, a read latency signal, a burst length signal, a write preamble signal, and a target code. The power gating control block is configured to generate an operation power control signal based on a power-down mode entry signal and a power-down mode exit signal. The data power driving circuit is configured to drive a data power signal based on the data power control signal. The operation power driving circuit is configured to drive an operation power signal based on the operation power control signal.

According to yet another embodiment, a semiconductor device includes a data section signal generation circuit, a data power gating signal generation circuit, and a data power driving circuit. The data section signal generation circuit is configured to activate a data period signal during a period that is set by a write latency, a burst length, and a write preamble period, the period being from a point in time in which a write mode signal is generated. The data section signal generation circuit is configured to activate the data period signal during another period that is set by a read latency and the burst length, the other period being from a point in time in which a read mode signal is generated. The data power gating signal generation circuit is configured to generate a data power control signal based on the data period signal and a target code. The data power driving circuit is configured to inhibit a data power signal from being driven based on the data power control signal.

DETAILED DESCRIPTION

Various embodiments of the present invention are described below in more detail with reference to the accompanying drawings. These embodiments are provided so that this disclosure is thorough and complete. All "embodiments" referred to in this disclosure refer to embodiments of the inventive concept disclosed herein. The embodiments presented are merely examples and are not intended to limit the scope of the invention. Throughout the specification, reference to "an embodiment, "another embodiment" or the like is not necessarily to only one embodiment, and different references to any such phrase are not necessarily to the same embodiment(s).

Moreover, it is noted that the terminology used herein is for the purpose of describing the embodiments and is not intended to be limiting of the invention. As used herein, singular forms are intended to include the plural forms and vice versa, unless the context clearly indicates otherwise. It will be further understood that the terms "comprises," "comprising," "includes" and/or "including" when used in this specification, indicate the presence of stated features, but do not preclude the presence or addition of one or more other non-stated features. As used herein, the term "and/or" indicates any and all combinations of one or more of the associated listed items. It is also noted that in this specification, "connected/coupled" refers to one component not only directly coupling another component but also indirectly coupling another component through an intermediate component. Communication between two elements, whether directly or indirectly connected/coupled, may be wired or wireless, unless the context indicates otherwise.

It will be understood that, although the terms "first", "second", "third", and so on may be used herein to identify various elements, these elements are not limited by these terms. These terms are used to distinguish one element from another element that otherwise have the same or similar names. Thus, a first element in one instance could be termed a second or third element in another instance without departing from the spirit and scope of the present invention.

The drawings are not necessarily to scale and, in some instances, proportions may have been exaggerated in order to clearly illustrate features of the embodiments.

Various embodiments of the present invention are directed to a semiconductor device having a power gating structure which is optimally designed depending on intended use.

Various embodiments of the present invention are directed to a semiconductor system including a semiconductor device that has a power gating structure which is optimally designed depending on intended use and performs a power gating operation regardless of control of a control device.

Figure 1A:
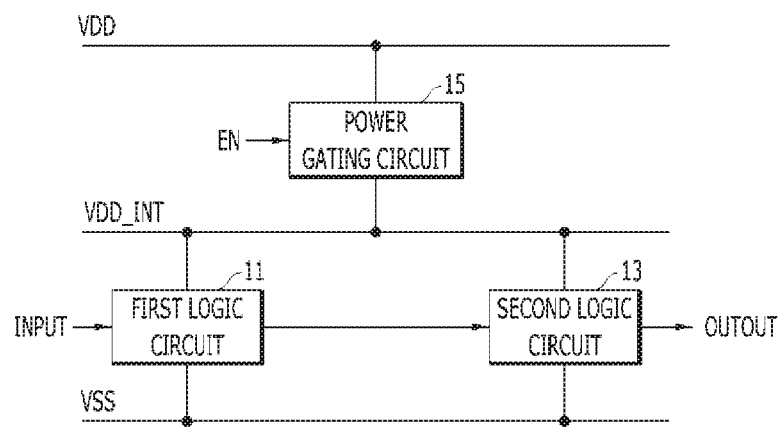
FIG. 1A is a block diagram, illustrating an example of a power gating structure.
Figure 1B:
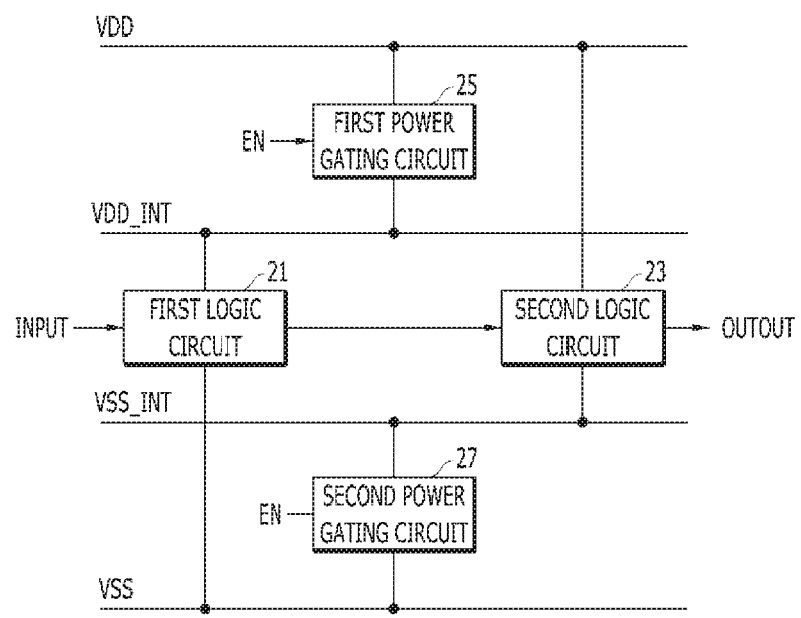
FIG. 1B is a block diagram, illustrating another example of a power gating structure.

FIGS. 1A and 1B are block diagrams illustrating examples of power gating structures applied to embodiments of the present invention.

FIG. 1A is a block diagram illustrating a header-only type of power gating structure. FIG. 1B is a block diagram illustrating a zigzag type of power gating structure.

Referring to FIG. 1A, the header-only type of power gating structure may be designed so that a power source voltage VDD is selectively supplied to first and second logic circuits 11 and 13 and a ground voltage VSS is continuously supplied to the first and second logic circuits 11 and 13.

To this end, the header-only type of power gating structure may include, in addition to the first and second logic circuits 11 and 13, a power gating circuit 15. The power gating circuit 15 may be coupled between a supply terminal of the power source voltage VDD and a supply terminal of a high voltage VDD_INT. The first and second logic circuits 11 and 13 may be coupled between the supply terminal of the high voltage VDD_INT and a supply terminal of the ground voltage VSS.

The power gating circuit 15 may electrically connect the supply terminal of the power source voltage VDD to, or disconnect such supply terminal from, the supply terminal of the high voltage VDD_INT based on an enable signal EN. For example, the power gating circuit 15 may electrically connect the supply terminal of the power source voltage VDD to the supply terminal of the high voltage VDD_INT when the enable signal EN is deactivated. Further, the power gating circuit 15 may electrically disconnect the supply terminal of the power source voltage VDD from the supply terminal of the high voltage VDD_INT when the enable signal EN is activated.

The first and second logic circuits 11 and 13 may perform logic operations based on the power source voltage VDD supplied through the power gating circuit 15 and the ground voltage VSS supplied directly.

Although FIG. 1A illustrates, as an example, one power gating circuit 15 and two logic circuits 11 and 13, the present invention is not limited to this configuration.

The header-only type of power gating structure having the aforementioned structure may minimize area consumption, performance deterioration and signal distortion caused by the power gating circuit 15. Therefore, in an embodiment of the present invention, the header-only type of power gating structure may be applied to a data path.

Referring to FIG. 1B, the zigzag type of power gating structure may be designed so that a power source voltage VDD is selectively supplied to a first logic circuit 21 and the ground voltage VSS is continuously supplied to the first logic circuit 21, and the power source voltage VDD is continuously supplied to a second logic circuit 23 and the ground voltage VSS is selectively supplied to the second logic circuit 23.

To this end, the zigzag type of power gating structure may include, in addition to the first and second logic circuits 21 and 23, a first power gating circuit 25 and a second power gating circuit 27. The first power gating circuit 25 may be coupled between a supply terminal of the power source voltage VDD and a supply terminal of a high voltage VDD_INT. The second power gating circuit 27 may be coupled a supply terminal of the ground voltage VSS and a supply terminal of a low voltage VSS_INT. The first logic circuit 21 may be coupled between the supply terminal of the high voltage VDD_INT and the supply terminal of the ground voltage VSS. The second logic circuit 23 may be coupled between the supply terminal of the power source voltage VDD and the supply terminal of the low voltage VSS_INT.

The first power gating circuit 25 may electrically connect the supply terminal of the power source voltage VDD to, or disconnect such supply terminal from, the supply terminal of the high voltage VDD_INT based on an enable signal EN. For example, the first power gating circuit 25 may electrically connect the supply terminal of the power source voltage VDD to the supply terminal of the high voltage VDD_INT when the enable signal EN is deactivated. Further, the first power gating circuit 25 may electrically disconnect the supply terminal of the power source voltage VDD from the supply terminal of the high voltage VDD_INT when the enable signal is activated.

The second power gating circuit 27 may electrically connect the supply terminal of the low voltage VSS_INT to, or disconnect such supply terminal from, the supply terminal of the ground voltage VSS based on the enable signal EN. For example, the second power gating circuit 27 may electrically connect the supply terminal of the low voltage VSS_INT to the supply terminal of the ground voltage VSS based on the deactivated enable signal EN. Further, the second power gating circuit 27 may electrically disconnect the supply terminal of the low voltage VSS_INT from the supply terminal of the ground voltage VSS based on the activated enable signal EN.

The first logic circuit 21 may perform a logic operation based on the power source voltage VDD supplied through the first power gating circuit 25 and the ground voltage VSS supplied directly.

The second logic circuit 23 may perform a logic operation based on the power source voltage VDD supplied directly and the ground voltage VSS supplied through the second power gating circuit 27.

Although FIG. 1B illustrates, as an example, one first power gating circuit 25, one second power gating circuit 27 and two logic circuits 21 and 23, the present invention is not limited to this configuration.

The zigzag type of power gating structure having the aforementioned structure may decrease a leakage current on a level similar to the header-only type of power gating structure while a logic state of an output terminal may be maintained without floating depending on a logic state of an input terminal in a set mode. Therefore, in an embodiment of the present invention, the zigzag type of power gating structure may be applied to a control path.

Figure 2:
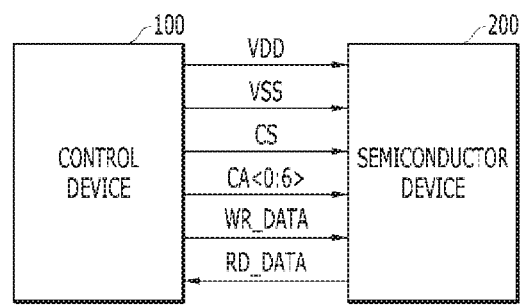
FIG. 2 is a block diagram, illustrating a semiconductor system, in accordance with an embodiment of the present invention.

FIG. 2 is a block diagram illustrating a semiconductor system in accordance with an embodiment of the present invention.

Referring to FIG. 2, the semiconductor system may include a control device 100 and a semiconductor device 200.

The control device 100 may output system control signals CS and CA<0:6> to the semiconductor device 200 based on the mode in which the semiconductor device 200 is in. The mode may include any one of a power-down mode PDE, an active mode ACT, a write mode WR and a read mode RD. The system control signals CS and CA<0:6> may include a chip selection signal CS and first to seventh command/address signals CA<0:6>. The system control signals CS and CA<0:6> corresponding to the respective modes may be generated as shown in the following Table 1.

TABLE 1

|     | CS | CA<0> | CA<1> | CA<2> | CA<3> | CA<4> | CA<5> | CA<6> |
| --- | --- | --- | --- | --- | --- | --- | --- | --- |
| PDE | H | L | L | L | L | L | L | H |
| WR  | H | L | H | H | C2 | C3 | C4 | C5 |
| RD  | H | H | L | B3 | C2 | C3 | C4 | C5 |

As shown in Table 1, the control device 100 may operate in the mode through a combination of all or some of the system control signals CS and CA<0:6>. For example, according to the power-down mode PDE, the control device 100 may generate the chip selection signal CS having a logic high level H, the first command/address signal CA<0> having a logic low level L, the second command/address signal CA<1> having the logic low level L, the third command/address signal CA<2> having the logic low level L, the fourth command/address signal CA<3> having the logic low level L, the fifth command/address signal CA<4> having the logic low level L, the sixth command/address signal CA<5> having the logic low level L and the seventh command/address signal CA<6> having the logic high level H. According to the write mode WR, the control device 100 may generate the chip selection signal CS having the logic high level H, the first command/address signal CA<0> having the logic low level L, the second command/address signal CA<1> having the logic high level H and the third command/address signal CA<b 2> having the logic high level H. In this case, the control device 100 may generate the fourth to seventh command/address signals CA<3:6> having specific information C2, C3, C4 and C5 together according to the write mode WR. Each of the specific information C2, C3, C4 and C5 may include address information required for the write mode WR or information for other function. According to the read mode RD, the control device 100 may generate the chip selection signal CS having the logic high level H, the first command/address signal CA<0> having the logic high level H and the second command/address signal CA<1> having the logic low level L. In this case, the control device 100 may generate the third to seventh command/address signals CA<2:6> having specific information B3, C2, C3, C4 and C5 together according to the read mode RD. Each of the specific information B3, C2, C3, C4 and C5 may include address information required for the read mode RD and information for other function.

Although it is described above that the modes include the power-down mode PDE, the write mode WR or the read mode RD, the present invention is not limited to this.

The control device 100 may output a write data signal WR_DATA to the semiconductor device 200 in the write mode WR. Further, the control device 100 may receive a read data signal RD_DATA from the semiconductor device 200 in the read mode RD.

The control device 100 may supply a power source voltage VDD and a ground voltage VSS to the semiconductor device 200.

The semiconductor device 200 may perform the power gating operation based on the system control signals CS and CA<0:6> when entering a particular mode. For example, the semiconductor device 200 may include a power gating circuit, and may disable the power gating circuit when entering a particular mode, which will be described in detail below.

Figure 3:
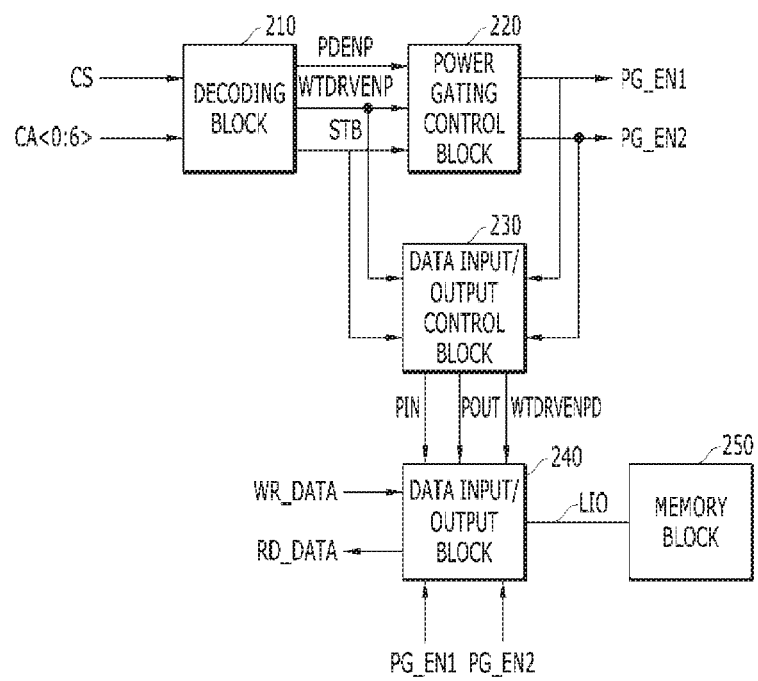
FIG. 3 is a block diagram, illustrating a semiconductor device, such as that shown in FIG. 2, in accordance with an embodiment of the present invention.

FIG. 3 is a block diagram illustrating a semiconductor device, e.g., the semiconductor device 200 shown in FIG. 2, in accordance with an embodiment of the present invention.

Referring to FIG. 3, the semiconductor device 200 may include a decoding block 210, a power gating control block 220, a data input/output control block 230, a data input/output block 240, and a memory block 250.

The decoding block 210 may generate enable signals PDENP, WTDRVENP and STB according to the set mode based on the system control signals CS and CA<0:6>. For example, the decoding block 210 may activate a power-down enable signal PDENP during a power-down period corresponding to the power-down mode PDE when a combination of the system control signals CS and CA<0:6> represents the power-down mode PDE. The decoding block 210 may activate a write enable signal WTDRVENP during a write period corresponding to the write mode WR when a combination of some signals CS and CS<0:2> of the system control signals CS and CA<0:6> represents the write mode WR. The decoding block 210 may activate a read enable signal STB during a read period corresponding to the read mode RD when a combination of some signals CS and CS<0:1> of the system control signals CS and CA<0:6> represents the read mode RD.

The power gating control block 220 may generate first and second enable signals PG_EN1 and PG_EN2 for controlling the power gating operation according to the set mode based on the power-down enable signal PDENP, the write enable signal WTDRVENP and the read enable signal STB. For example, the power gating control block 220 may activate the first and second enable signals PG_EN1 and PG_EN2 during the power-down period based on the power-down enable signal PDENP which is activated. The power gating control block 220 may activate the first enable signal PG_EN1 and deactivate the second enable signal PG_EN2 during the write period based on the write enable signal WTDRVENP which is activated. The power gating control block 220 may activate the second enable signal PG_EN2 and deactivate the first enable signal PG_EN1 during the read period based on the read enable signal STB which is activated.

The data input/output control block 230 may generate control signals PIN, POUT and WTDRVENPD based on the write enable signal WTDRVENP, the read enable signal STB and the first and second enable signals PG_EN1 and PG_EN2. First and second read control signals PIN and POUT may be related to the read mode RD, and a write control signal WTDRVENPD may be related to the write mode WR.

The data input/output block 240 may receive the write data signal WR_DATA and output the read data signal RD_DATA based on the control signals PIN, POUT and WTDRVENPD and the first and second enable signals PG_EN1 and PG_EN2.

The memory block 250 may be coupled to the data input/output block 240 through a local input/output line LIO. The memory block 250 may write a data signal, which corresponds to the write data signal WR_DATA, received through the local input/output line LIO and read a data signal, which corresponds to the read data signal RD_DATA, through the local input/output line LIO.

Figure 4:
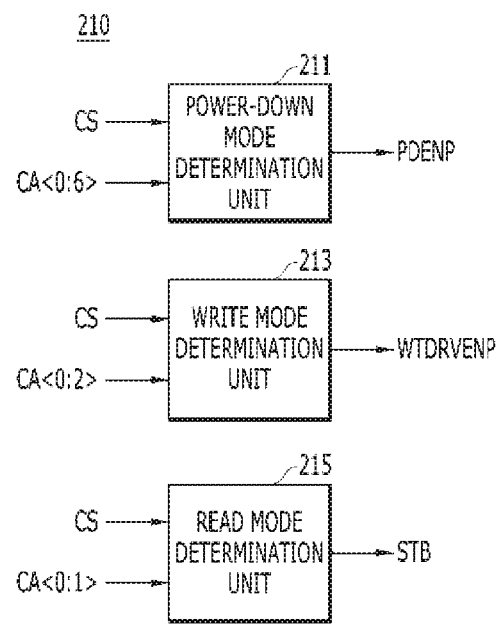
FIG. 4 is a block diagram, illustrating a decoding block, such as that shown in FIG. 3, in accordance with an embodiment of the present invention.

FIG. 4 is a block diagram illustrating a decoding block, e.g., the decoding block 210 shown in FIG. 3, in accordance with an embodiment of the present invention.

Referring to FIG. 4, the decoding block 210 may include a power-down mode determiner 211, a write mode determiner 213, and a read mode determiner 215.

The power-down mode determiner 211 may generate the power-down enable signal PDENP, which is activated during the power-down period and deactivated during the read period, based on the system control signals CS and CA<0:6>. For example, the power-down mode determiner 211 may activate the power-down enable signal PDENP to a logic high level during the power-down period and deactivate the power-down enable signal PDENP to a logic low level during the write and read periods.

The write mode determiner 213 may generate the write enable signal WTDRVENP, which is activated during the write period and deactivated during the power-down period and the read period, based on some signals CS and CA<0:2> of the system control signals CS and CA<0:6>. For example, the write mode determiner 213 may activate the write enable signal WTDRVENP to a logic high level during the write period and deactivate the write enable signal WTDRVENP to a logic low level during the power-down period and the read period.

The read mode determiner 215 may generate the read enable signal STB, which is activated during the read period and deactivated during the power-down period and the write period, based on some signals CS and CA<0:1> of the system control signals CS and CA<0:6>. For example, the read mode determiner 215 may activate the read enable signal STB to a logic high level during the read period and deactivate the read enable signal STB to a logic low level during the power-down period and the write period.

Figure 5:
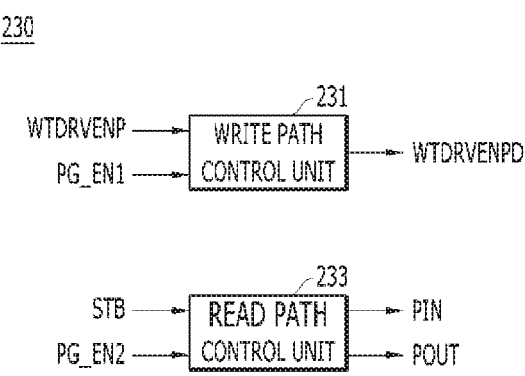
FIG. 5 is a block diagram, illustrating a data input/output control block, such as that shown in FIG. 3, in accordance with an embodiment of the present invention.

FIG. 5 is a block diagram illustrating a data input/output control block, e.g., the data input/output control block 230 shown in FIG. 3, in accordance with an embodiment of the present invention.

Referring to FIG. 5, the data input/output control block 230 may include a write path controller 231, and a read path controller 233.

The write path controller 231 may generate the write control signal WTDRVENPD based on the write enable signal WTDRVENP and the first enable signal PG_EN1. For example, the write path controller 231 may activate the write control signal WTDRVENPD during the write period and deactivate the write control signal WTDRVENPD during the read period and the power-down period.

The read path controller 233 may generate the first and second read control signals PIN and POUT based on the read enable signal STB and the second enable signal PG_EN2. For example, the read path controller 233 may activate the first and second read control signals PIN and POUT during the read period and deactivate the first and second read control signals PIN and POUT during the write period and the power-down period.

Figure 6:
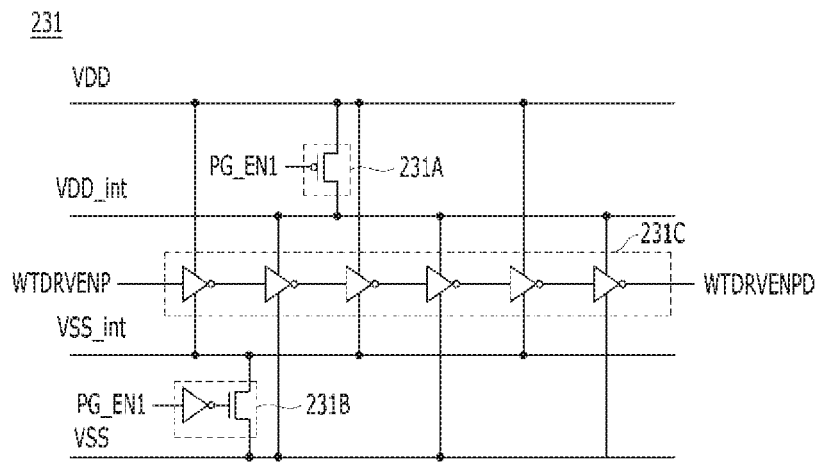
FIG. 6 is a diagram, illustrating a write path controller, such as that shown in FIG. 5, in accordance with an embodiment of the present invention.

FIG. 6 is a diagram illustrating a write path control, e.g., the write path controller 231 shown in FIG. 5, in accordance with an embodiment of the present invention.

Referring to FIG. 6, the write path controller 231 may include a first power gating circuit 231A, a second power gating circuit 231B, and a first logic circuit 231C. In other words, the write path controller 231 may have the zigzag type of power gating structure.

The first power gating circuit 231A may be coupled between a supply terminal of the power source voltage VDD and a supply terminal of a high voltage VDD_int. The first power gating circuit 231A may electrically connect the supply terminal of the power source voltage VDD to, or disconnect such supply terminal from, the supply terminal of the high voltage VDD_int based on the first enable signal PG_EN1. When the supply terminal of the power source voltage VDD is electrically connected to the supply terminal of the high voltage VDD_int through the first power gating circuit 231A, the supply terminal of the high voltage VDD_int may have almost the same voltage level as the power source voltage VDD. For example, the high voltage VDD_int may correspond to a difference between the power source voltage VDD and a threshold voltage of a transistor included in the first power gating circuit 231A. When the supply terminal of the power source voltage VDD is electrically disconnected from the supply terminal of the high voltage VDD_int by the first power gating circuit 231A, the supply terminal of the high voltage VDD_int may be in a floating state.

The second power gating circuit 231B may be coupled between a supply terminal of the ground voltage VSS and a supply terminal of a low voltage VSS_int. The second power gating circuit 231B may electrically connect the supply terminal of the ground voltage VSS to, or disconnect such supply terminal from, the supply terminal of the low voltage VSS_int based on the first enable signal PG_EN1. When the supply terminal of the ground voltage VSS is electrically connected to the supply terminal of the low voltage VSS_int through the second power gating circuit 231B, the supply terminal of the low voltage VSS_int may have almost the same voltage level as the ground voltage VSS. For example, the low voltage VSS_int may correspond to a difference between the ground voltage VSS and a threshold voltage of a transistor included in the second power gating circuit 231B. When the supply terminal of the ground voltage VSS is electrically disconnected from the supply terminal of the low voltage VSS_int by the second power gating circuit 231B, the supply terminal of the low voltage VSS_int may be in a floating state.

The first logic circuit 231C may be coupled to the supply terminal of the power source voltage VDD, the supply terminal of the ground voltage VSS, the supply terminal of the high voltage VDD_int and the supply terminal of the low voltage VSS_int. For example, the first logic circuit 231C may include a plurality of logic elements, for example, an inverter, that are coupled in series to each other. Odd-numbered logic elements of the logic elements may be coupled between the supply terminal of the power source voltage VDD and the supply terminal of the low voltage VSS_int. Even-numbered logic elements of the logic elements may be coupled between the supply terminal of the high voltage VDD_int and the supply terminal of the ground voltage VSS. The first logic circuit 231C may delay the write enable signal WTDRVENP by a set delay time to generate the write control signal WTDRVENPD. In other words, the first logic circuit 231C may generate the write control signal WTDRVENPD which is activated after the write enable signal WTDRVENP is activated and the delay time passes, during the write period. In addition, the first logic circuit 231C may generate the write control signal WTDRVENPD which is deactivated based on the write enable signal WTDRVENP which is deactivated, during the read period and the power-down period. The write control signal WTDRVENPD may be kept in a deactivated state during the read period and the power-down period because the plurality of logic elements included in the first logic circuit 231C are coupled in the zigzag type between the supply terminal of the power source voltage VDD and the supply terminal of the ground voltage VSS.

Figure 7:
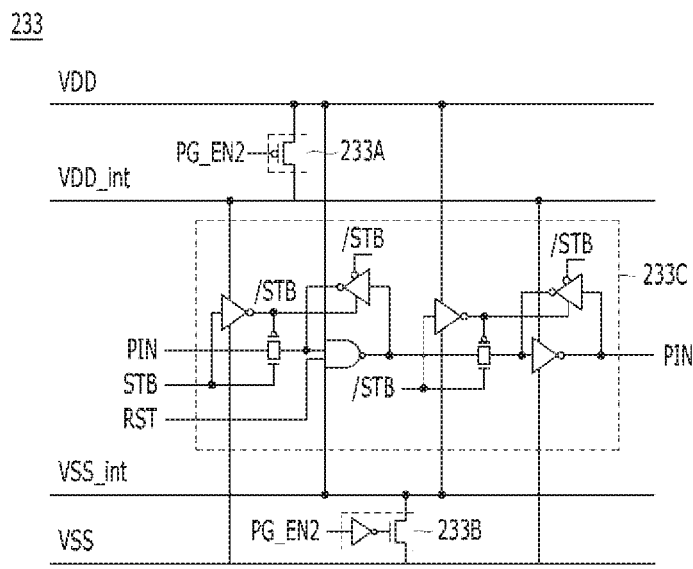
FIG. 7 is a diagram, illustrating a read path controller, such as that shown in FIG. 5, in accordance with an embodiment of the present invention.

FIG. 7 is a diagram illustrating a read path control, e.g., the read path control 233 shown in FIG. 5, in accordance with an embodiment of the present invention. For clarity, FIG. 7 illustrates just a circuit for generating the first read control signal PIN.

Referring to FIG. 7, the read path controller 233 may include a third power gating circuit 233A, a fourth power gating circuit 233B, and a second logic circuit 233C. In other words, the read path controller 233 may have the zigzag type of power gating structure.

The third power gating circuit 233A may be coupled between the supply terminal of the power source voltage VDD and the supply terminal of the high voltage VDD_int. The third power gating circuit 233A may electrically connect the supply terminal of the power source voltage VDD to, or disconnect such supply terminal from, the supply terminal of the high voltage VDD_int based on the second enable signal PG_EN2. When the supply terminal of the power source voltage VDD is electrically connected to the supply terminal of the high voltage VDD_int through the third power gating circuit 233A, the supply terminal of the high voltage VDD_int may have almost the same voltage level as the power source voltage VDD. For example, the high voltage VDD_int may correspond to a difference between the power source voltage VDD and a threshold voltage of a transistor included in the third power gating circuit 233A. When the supply terminal of the power source voltage VDD is electrically disconnected from the supply terminal of the high voltage VDD_int by the third power gating circuit 233A, the supply terminal of the high voltage VDD_int may be in a floating state.

The fourth power gating circuit 233B may be coupled between the supply terminal of the ground voltage VSS and the supply terminal of the low voltage VSS_int. The fourth power gating circuit 233B may electrically connect the supply terminal of the ground voltage VSS to, or disconnect such supply terminal from, the supply terminal of the low voltage VSS_int based on the second enable signal PG_EN2, When the supply terminal of the ground voltage VSS is electrically connected to the supply terminal of the low voltage VSS_int through the fourth power gating circuit 233B, the supply terminal of the low voltage VSS_int may have almost the same voltage level as the ground voltage VSS. For example, the low voltage VSS_int may correspond to a difference between the ground voltage VSS and a threshold voltage of a transistor included in the fourth power gating circuit 233B. When the supply terminal of the ground voltage VSS is electrically disconnected from the supply terminal of the low voltage VSS_int by the fourth power gating circuit 233B, the supply terminal of the low voltage VSS_int may be in a floating state.

The second logic circuit 233C may be coupled to the supply terminal of the power source voltage VDD, the supply terminal of the ground voltage VSS, the supply terminal of the high voltage VDD_int and the supply terminal of the low voltage VSS_int. For example, the second logic circuit 233C may include a generation path of the first read control signal PIN. The generation path of the first read control signal PIN may include a plurality of logic elements, for example, a NAND gate and an inverter, that are coupled in series to each other. Odd-numbered logic elements, for example, the NAND gate, of the logic elements may be coupled between the supply terminal of the power source voltage VDD and the supply terminal of the low voltage VSS_int. Even-numbered logic elements, for example, the inverter, of the logic elements may be coupled between the supply terminal of the high voltage VDD_int and the supply terminal of the ground voltage VSS. In addition, the second logic circuit 233C may include an input path of the read enable signal STB. The input path of the read enable signal STB may include a plurality of logic elements, for example, an inverter. Odd-numbered logic elements of the logic elements may be coupled between the supply terminal of the high voltage VDD_int and the supply terminal of the ground voltage VSS. Even-numbered logic elements of the logic elements may be coupled between the supply terminal of the power source voltage VDD and the supply terminal of the low voltage VSS_int. The second logic circuit 233C may generate the first read control signal PIN based on the read enable signal STB. For example, the second logic circuit 233C may latch and output the first read control signal PIN based on the read enable signal STB.

Although not illustrated, the read path controller 233 may include a circuit for generating the second read control signal POUT, which may have the zigzag type of power gating structure as described above.

Figure 8:
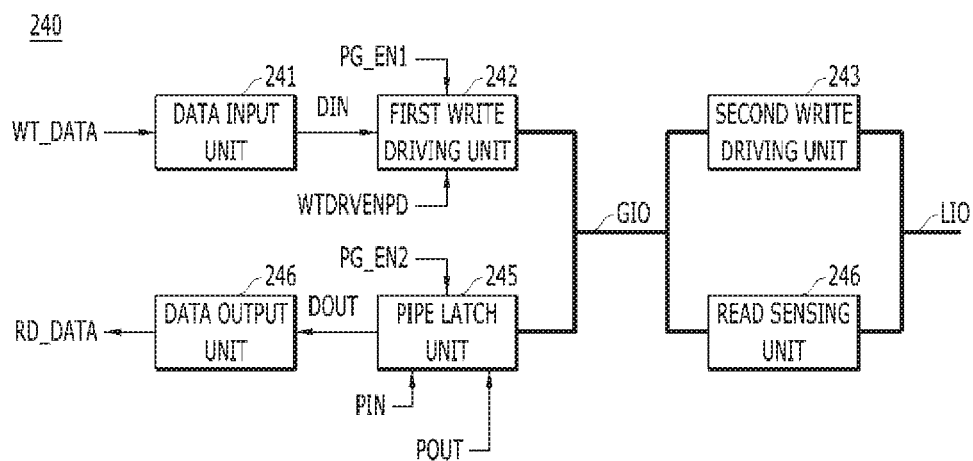
FIG. 8 is a block diagram, illustrating a data input/output block, such as that shown in FIG. 3, in accordance with an embodiment of the present invention.

FIG. 8 is a block diagram illustrating a data input/output block, e.g., the data input/output block 240 shown in FIG. 3, in accordance with an embodiment of the present invention.

Referring to FIG. 8, the data input/output block 240 may include data input paths 241, 242 and 243 which refer to data write paths, and data output paths 244, 245 and 246 which refer to data read paths.

The data input paths may be enabled in the write mode WR, and may include a data input buffer 241, a first write driver 242, and a second write driver 243. The data input buffer 241 may output an input data signal DIN based on the write data signal WR_DATA. The first write driver 242 may receive the input data signal DIN, and transmit the input data signal DIN to a global input/output line GIO based on the write control signal WTDRVENPD and the first enable signal PG_EN1. The second write driver 243 may transmit the data signal received through the global input/output line GIO to the memory block 250 of FIG. 3 through the local input/output line LIO.

The data output paths may be enabled in the read mode RD, and may include a read sensor 244, a pipe latch 245, and a data output buffer 246. The read sensor 244 may transmit the data signal read from the memory block 250 through the local input/output line LIO to the global input/output line GIO. The pipe latch 245 may latch the data signal received through the global input/output line GIO based on the first read control signal PIN, the second read control signal POUT and the second enable signal PG_EN2. The data output buffer 246 may output the read data signal RD_DATA based on an output data signal DOUT latched in the pipe latch 245.

Figure 9:
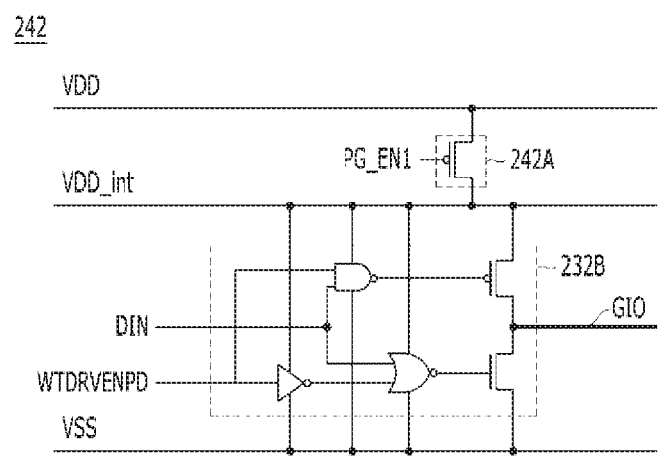
FIG. 9 is a diagram, illustrating a first write driver, such as that shown in FIG. 8, in accordance with an embodiment of the present invention.

FIG. 9 is a diagram illustrating a first write driver, e.g., the first write driver 242 shown in FIG. 8, in accordance with an embodiment of the present invention.

Referring to FIG. 9, the first write driver 242 may include a fifth power gating circuit 242A, and a third logic circuit 242B. In other words, the first write driver 242 may have the header-only type of power gating structure.

The fifth power gating circuit 242A may be coupled between the supply terminal of the power source voltage VDD and the supply terminal of the high voltage VDD_int. The fifth power gating circuit 242A may electrically connect the supply terminal of the power source voltage VDD to, or disconnect such supply terminal from, the supply terminal of the high voltage VDD_int based on the first enable signal PG_EN1, When the supply terminal of the power source voltage VDD is electrically connected to the supply terminal of the high voltage VDD_int through the fifth power gating circuit 242A, the supply terminal of the high voltage VDD_int may have almost the same voltage level as the power source voltage VDD. For example, the high voltage VDD_int may correspond to a difference between the power source voltage VDD and a threshold voltage of a transistor included in the fifth power gating circuit 242A. When the supply terminal of the power source voltage VDD is electrically disconnected from the supply terminal of the high voltage VDD_int by the fifth power gating circuit 242A, the supply terminal of the high voltage VDD_int may be in a floating state.

The third logic circuit 242B may be coupled between the supply terminal of the high voltage VDD_int and the supply terminal of the ground voltage VSS. The third logic circuit 242B may drive the global input/output line GIO with the high voltage VDD_int or the ground voltage VSS based on the input data signal DIN and the write control signal WTDRVENPD.

Figure 10:
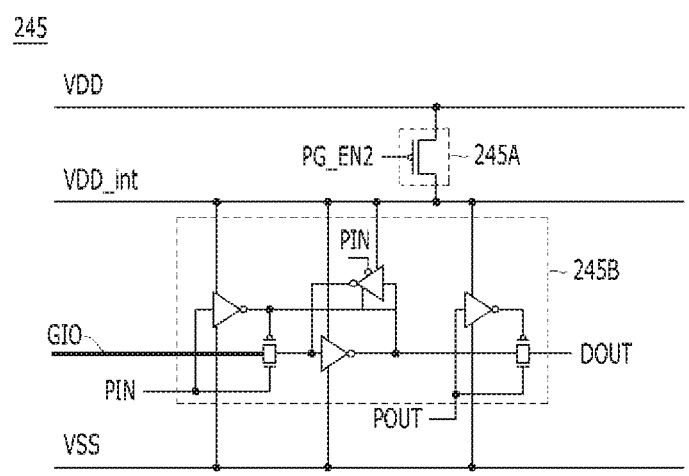
FIG. 10 is a diagram, illustrating a pipe latch, such as that shown in FIG. 8, in accordance with an embodiment of the present invention.

FIG. 10 is a diagram illustrating a pipe latch, e.g., the pipe latch 245 shown in FIG. 8, in accordance with an embodiment of the present invention.

Referring to FIG. 10, the pipe latch 245 may include a sixth power gating circuit 245A, and a fourth logic circuit 245B. In other words, the pipe latch 245 may have the header-only type of power gating structure.

The sixth power gating circuit 245A may be coupled between the supply terminal of the power source voltage VDD and the supply terminal of the high voltage VDD_int. The sixth power gating circuit 245A may electrically connect the supply terminal of the power source voltage VDD to, or disconnect such supply terminal from, the supply terminal of the high voltage VDD_int based on the second enable signal PG_EN2. When the supply terminal of the power source voltage VDD is electrically connected to the supply terminal of the high voltage VDD_int through the sixth power gating circuit 245A, the supply terminal of the high voltage VDD_int may have almost the same voltage level as the power source voltage VDD. For example, the high voltage VDD_int may correspond to a difference between the power source voltage VDD and a threshold voltage of a transistor included in the sixth power gating circuit 245A. When the supply terminal of the power source voltage VDD is electrically disconnected from the supply terminal of the high voltage VDD_int by the sixth power gating circuit 245A, the supply terminal of the high voltage VDD_int may be in a floating state.

The fourth logic circuit 245B may be coupled between the supply terminal of the high voltage VDD_int and the supply terminal of the ground voltage VSS. The fourth logic circuit 245B may latch the data signal received through the global input/output line GIO based on the first read control signal PIN, and output the latched data signal as the output data signal DOUT based on the second read control signal POUT.

Hereinafter, an operation of the semiconductor system having the aforementioned structure is described.

First, an operation of the semiconductor system corresponding to the power-down mode PDE is described.

The control device 100 of FIG. 2 may generate the system control signals CS and CA<0:6> corresponding to the power-down mode PDE.

The semiconductor device 200 may internally control the power gating operation based on the system control signals CS and CA<0:6> when entering the power-down mode PDE. For example, the decoding block 210 of FIG. 3 may activate the power-down enable signal PDENP based on the system control signals CS and CA<0:6> during the power-down period. The power gating control block 220 may activate the first and second enable signals PG_EN1 and PG_EN2 based on the activated power-down enable signal PDENP. As shown in FIGS. 5 to 7, each of the first to fourth power gating circuits 231A, 231B, 233A and 233B included in the data input/output control block 230 may be disabled based on the first enable signal PG_EN1 or the second enable signal PG_EN2 during the power-down period. As shown in FIGS. 8 to 10, each of the fifth and sixth power gating circuits 242A and 245A included in the data input/output block 240 may be disabled based on the first enable signal PG_EN1 or the second enable signal PG_EN2 during the power-down period.

Accordingly, a leakage current caused by the data input/output control block 230 and the data input/output block 240 in the power-down mode PDE may be minimized.

Next, an operation of the semiconductor system corresponding to the write mode WR is described.

The control device 100 of FIG. 2 may generate the system control signals CS and CA<0:6> corresponding to the write mode WR.

The semiconductor device 200 may internally control the power gating operation based on the system control signals CS and CA<0:6> when entering the write mode WR. For example, the decoding block 210 of FIG. 3 may activate the write enable signal WTDRVENP based on the system control signals CS and CA<0:6> during the write period. The power gating control block 220 may deactivate the first enable signal PG_EN1 and activate the second enable signal PG_EN2 based on the activated write enable signal WTDRVENP, As shown in FIGS. 5 to 7, the first and second power gating circuits 231A and 231B included in the data input/output control block 230 may be enabled based on the first enable signal PG_EN1 during the write period, and the third and fourth power gating circuits 233A and 233B included in the data input/output control block 230 may be disabled based on the second enable signal PG_EN2 during the write period. As shown in FIGS. 8 to 10, the fifth power gating circuit 242A included in the data input/output block 240 may be enabled based on the first enable signal PG_EN1 during the write period, and the sixth power gating circuit 245A included in the data input/output block 240 may be disabled based on the second enable signal PG_EN2 during the write period.

Accordingly, in the write mode WR, as the first write driver 242 has the power gating structure in which performance deterioration caused by the fifth power gating circuit 242A is almost negligible, a high-speed write operation and a reliable write operation may be realized. Further, a leakage current generated by the read path controller 233 and the pipe latch 245 in the write mode WR may be minimized.

Finally, an operation of the semiconductor system corresponding to the read mode RD is described.

The control device 100 of FIG. 2 may generate the system control signals CS and CA<0:6> corresponding to the read mode RD.

The semiconductor device 200 may internally control the power gating operation based on the system control signals CS and CA<0:6> when entering the read mode RD. For example, the decoding block 210 of FIG. 3 may activate the read enable signal STB based on the system control signals CS and CA<0:6> during the read period. The power gating control block 220 may activate the first enable signal PG_EN1 and deactivate the second enable signal PG_EN2 based on the activated read enable signal STB. As shown in FIGS. 5 to 7, the first and second power gating circuits 231A and 231B included in the data input/output control block 230 may be disabled based on the first enable signal PG_EN1 during the read period, and the third and fourth power gating circuits 233A and 233B included in the data input/output control block 230 may be enabled based on the second enable signal PG_EN2 during the read period. As shown in FIGS. 8 to 10, the fifth power gating circuit 242A included in the data input/output block 240 may be disabled based on the first enable signal PG_EN1 during the read period, and the sixth power gating circuit 245A included in the data input/output block 240 may be enabled based on the second enable signal PG_EN2 during the read period.

Accordingly, in the read mode RD, as the pipe latch 245 has the power gating structure in which performance deterioration caused by the sixth power gating circuit 245A is almost negligible, a high-speed read operation and a reliable read operation may be realized. Further, a leakage current generated by the write path controller 231 and the first write driver 242 in the read mode RD may be minimized.

As described above, a semiconductor device may internally control a power gating operation. Specifically, as a header-only type of power gating structure is applied to a data path of the semiconductor device and a zigzag type of power gating structure is applied to a control path of the semiconductor device, performance deterioration of a semiconductor system caused by a power gating circuit may be minimized.

In accordance with embodiments of the present invention, as the semiconductor device has a power gating structure which is optimally designed depending on intended use, an area overhead and performance deterioration caused by a power gating circuit may be minimized.

Also, in accordance with embodiments of the present invention, as a semiconductor device performs a power gating operation regardless of control of a control device, the processing amount of the control device and a power overhead may be minimized.

Figure 11:
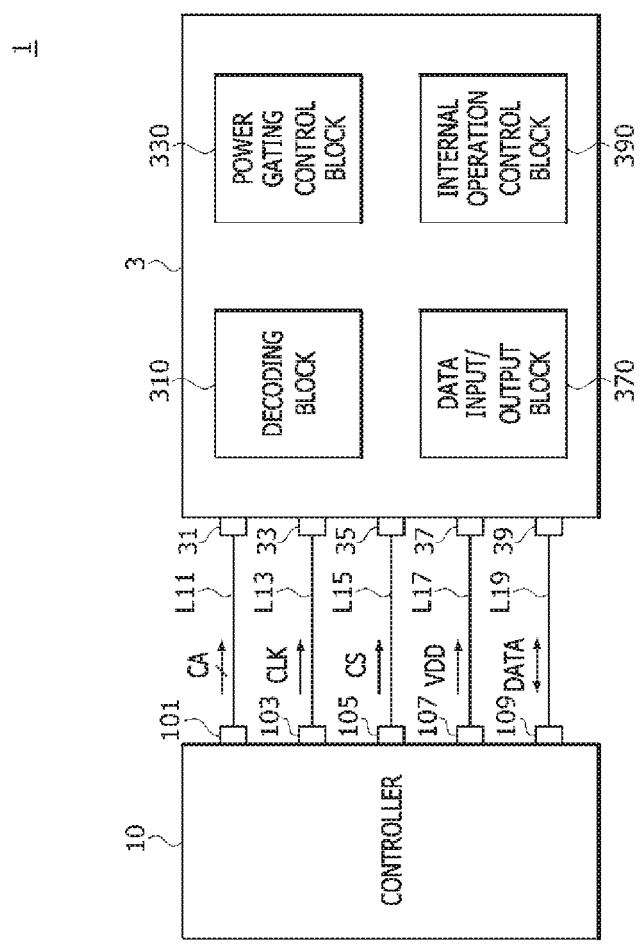
FIG. 11 is a block diagram, illustrating a configuration of a semiconductor system, according to an embodiment of the present disclosure.

FIG. 11 is a block diagram, illustrating a configuration of a semiconductor system 1, according to an embodiment of the present disclosure. As illustrated in FIG. 11, the semiconductor system 1 may include a controller 10 and a semiconductor device 3. The semiconductor device 3 may include a decoding block 310, a power gating control block 330, a data input/output block 370, and an internal operation control block 390.

The controller 10 may include a first control pin 101, a second control pin 103, a third control pin 105, a fourth control pin 107, and a fifth control pin 109. The semiconductor device 3 may include a first semiconductor pin 31, a second semiconductor pin 33, a third semiconductor pin 35, a fourth semiconductor pin 37, and a fifth semiconductor pin 39. The first control pin 101 and the first semiconductor pin 31 may be connected to each other through a first transmission line L11. The second control pin 103 and the second semiconductor pin 33 may be connected to each other through a second transmission line L13. The third control pin 105 and the third semiconductor pin 35 may be connected to each other through a third transmission line L15. The fourth control pin 107 and the fourth semiconductor pin 37 may be connected to each other through a fourth transmission line L17. The fifth control pin 109 and the fifth semiconductor pin 39 may be connected to each other through a fifth transmission line L19. The controller 10 may transmit a command/address signal CA to the semiconductor device 3 through the first transmission line L11 to control the semiconductor device 3. The controller 10 may transmit a clock signal CLK to the semiconductor device 3 through the second transmission line L13 to control the semiconductor device 3. The controller 10 may transmit a chip selection signal CS to the semiconductor device 3 through the third transmission line L15 to control the semiconductor device 3. The controller 10 may supply a power source voltage VDD to the semiconductor device 3 through the fourth transmission line L17 to control the semiconductor device 3. The controller 10 may transmit data DATA to the semiconductor device 3 or may receive the data DATA from the semiconductor device 3 through the fifth transmission line L19.

The decoding block 310 may decode the command/address signal CA based on the clock signal CLK and the chip selection signal CS to generate various signals to activate a power-down mode, a write mode, a read mode, and a mode register write mode.

The power gating control block 330 may activate a data power control signal (PCNT_D of FIG. 12) to drive a data power signal (PS_D of FIG. 12) during a period that is set by a target code (TC of FIG. 12), from a point in time in which the read mode or the write mode is activated. The power gating control block 330 may deactivate an operation power control signal (PCNT_C of FIG. 12) to inhibit an operation power signal (PS_C of FIG. 12) from being driven during the power-down mode (i.e., during a period from a point in time in which the power-down mode begins till a point in time in which the power-down mode terminates).

The data input/output block 370 may receive the data power signal PS_D, which is driven by the data power control signal PCNT_D, to operate. The data input/output block 370 may receive the data power signal PS_D to perform a data input/output operation during a period that is set by the target code TC, from a point in time in which the read mode or the write mode is activated. As a result, it may be possible to reduce power consumption of the semiconductor device 3.

The internal operation control block 390 may receive the operation power signal which is driven by the operation power control signal PCNT_C, to operate. The internal operation control block 390 may receive the operation power signal PS_C to perform an internal operation during the power-down mode (i.e., during a period from a point in time in which the power-down mode begins till a point in time in which the power-down mode terminates). As a result, it may be possible to reduce power consumption of the semiconductor device 3.

Figure 12:
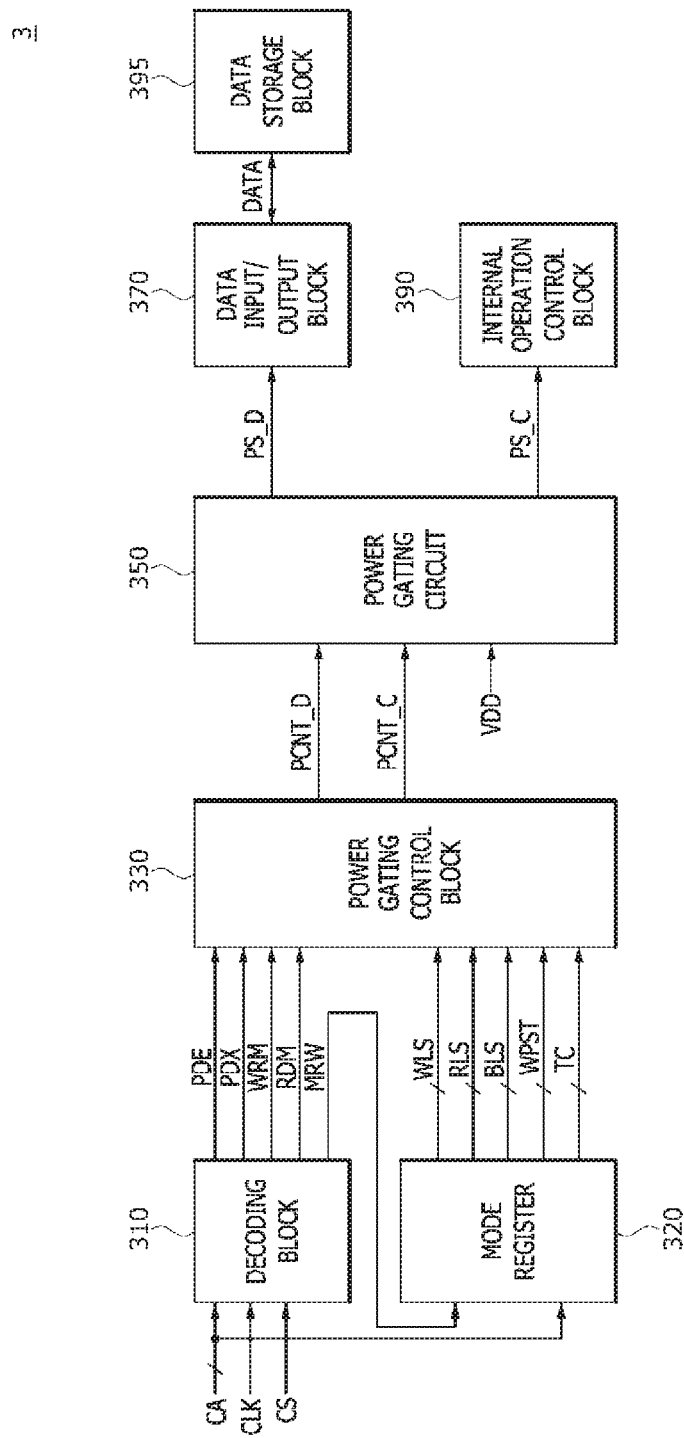
FIG. 12 is a block diagram, illustrating a configuration of a semiconductor device, included in the semiconductor system that is illustrated in FIG. 11.

FIG. 12 is a block diagram, illustrating a configuration of the semiconductor device 3. As illustrated in FIG. 12, the semiconductor device 3 may include the decoding block 310, a mode register 320, the power gating control block 330, a power gating circuit 350, the data input/output block 370, the internal operation control block 390, and a data storage block 395.

The decoding block 310 may generate a power-down mode entry signal PDE, a power-down mode exit signal PDX, a write mode signal WRM, a read mode signal RDM, and a mode register write signal MRW based on the command/address signal CA, the clock signal CLK, and the chip selection signal CS. The decoding block 310 may decode the command/address signal CA based on the clock signal CLK and the chip selection signal CS to generate the power-down mode entry signal PDE, the power-down mode exit signal PDX, the write mode signal WRM, the read mode signal RDM, and the mode register write signal MRW. The power-down mode entry signal PDE may be generated to enter the power-down mode. The power-down mode exit signal PDX may be activated to exit the power-down mode. The write mode signal WRM may be activated to enter the write mode. The read mode signal RDM may be activated to enter the read mode. The mode register write signal MRW may be generated to activate the mode register write mode for storing various pieces of information into the mode register 320. Various logic level combinations of bit signals included in the command/address signal CA to activate the power-down mode entry signal PDE, the power-down mode exit signal PDX, the write mode signal WRM, the read mode signal RDM, and the mode register write signal MRW may be set to be different according to the embodiments.

The mode register 320 may store and output a write latency signal WLS, a read latency signal RLS, a burst length signal BLS, a write preamble signal WPST, and the target code TC based on the mode register write signal MRW and the command/address signal CA. When the mode register write signal MRW is activated, the mode register 320 may extract the write latency signal WLS, the read latency signal RLS, the burst length signal BLS, the write preamble signal WPST, and the target code TC from the command/address signal CA and may store the write latency signal WLS, the read latency signal RLS, the burst length signal BLS, the write preamble signal WPST, and the target code TC therein. The mode register 320 may apply the write latency signal WPS, the read latency signal RLS, the burst length signal BLS, the write preamble signal WPST, and the target code TC to the power gating control block 330. The write latency signal WLS may include bits with signals that have a logic level combination that corresponds to a write latency. The write latency may be set as a period from a point in time in which a write command is inputted to the semiconductor device 3 till a point in time in which the data DATA is inputted to the data storage block 395 of the semiconductor device 3. The read latency signal RLS may include bits with signals that have a logic level combination that corresponds to a read latency. The read latency may be set as a period from a point in time in which a read command is inputted to the semiconductor device 3 till a point in time in which the data DATA is outputted from the data storage block 395 of the semiconductor device 3. The burst length signal BLS may include bits with signals that have a logic level combination that corresponds to a burst length. The burst length may be set as the number of bits included in the data DATA which are continuously inputted to or outputted from the semiconductor device 3 by one command. The write preamble signal WPST may include bits with signals that have a logic level combination that corresponds to a write preamble period. The write preamble period may be set as a period that a data input/output clock signal is inputted after the data DATA is inputted in the write mode. The target code TC may be set to have a predetermined logic level combination.

The power gating control block 330 may generate the data power control signal PCNT_D and the operation power control signal PCNT_C based on the power-down mode entry signal PDE, the power-down mode exit signal PDX, the write mode signal WRM, the read mode signal RDM, the write latency signal WLS, the read latency signal RLS, the burst length signal BLS, the write preamble signal WPST, and the target code TC. The power gating control block 330 may activate the data power control signal PCNT_D to drive the data power signal PS_D during a period that is set by the target code TC, from a point in time in which the read mode or the write mode is activated based on the write mode signal WRM, the read mode signal RDM, the write latency signal WLS, the read latency signal RLS, the burst length signal BLS, the write preamble signal WPST, and the target code TC. The power gating control block 330 may deactivate the operation power control signal PCNT_C to inhibit the operation power signal PS_C from being driven during the power-down mode (i.e., during a period from a point in time in which the power-down mode begins till a point in time in which the power-down mode terminates) based on the power-down mode entry signal PDE and the power-down mode exit signal PDX.

The power gating circuit 350 may generate the data power signal PS_D and the operation power signal PS_C based on the data power control signal PCNT_D, the operation power control signal PCNT_C, and the power source voltage VDD. The power gating circuit 350 may receive the power source voltage VDD to drive the data power signal PS_D when the data power control signal PCNT_D is activated and may receive the power source voltage VDD to drive the operation power signal PS_C when the operation power control signal PCNT_C is activated.

The data input/output block 370 may receive the data power signal PS_D to perform an operation to input the data DATA to the data storage block 395 or to output the data DATA from the data storage block 395. The data input/output block 370 may receive the data DATA during a period that is set by the target code TC, from a point in time in which the read mode or the write mode is activated. The data input/output block 370 may include some circuits that are necessary to input or output the data DATA, for example, a data alignment circuit for aligning the data DATA, a data drive circuit, an input/output line sense amplifier, a repeater, and so forth.

The internal operation control block 390 may receive the operation power signal PS_C to perform an internal operation. The internal operation control block 390 may interrupt the supply of the operation power signal PS_C only during the power-down mode (i.e., only during a period from a point in time in which the power-down mode begins till a point in time in which the power-down mode terminates). The internal operation control block 390 may include some circuits that are necessary for various internal operations other than the data input/output operation, such as a decoding block, a mode register decoder, a latency shifting register, a phase detector, a counter, and so forth. Although FIG. 12 illustrates the internal operation control block 390 with a single block separated from the decoding block 310, the mode register 320, the power gating control block 330, and the power gating circuit 350, the internal operation control block 390 may be designed to include the decoding block 310, the mode register 320, the power gating control block 330, and the power gating circuit 350 according to the embodiments.

Figure 13:
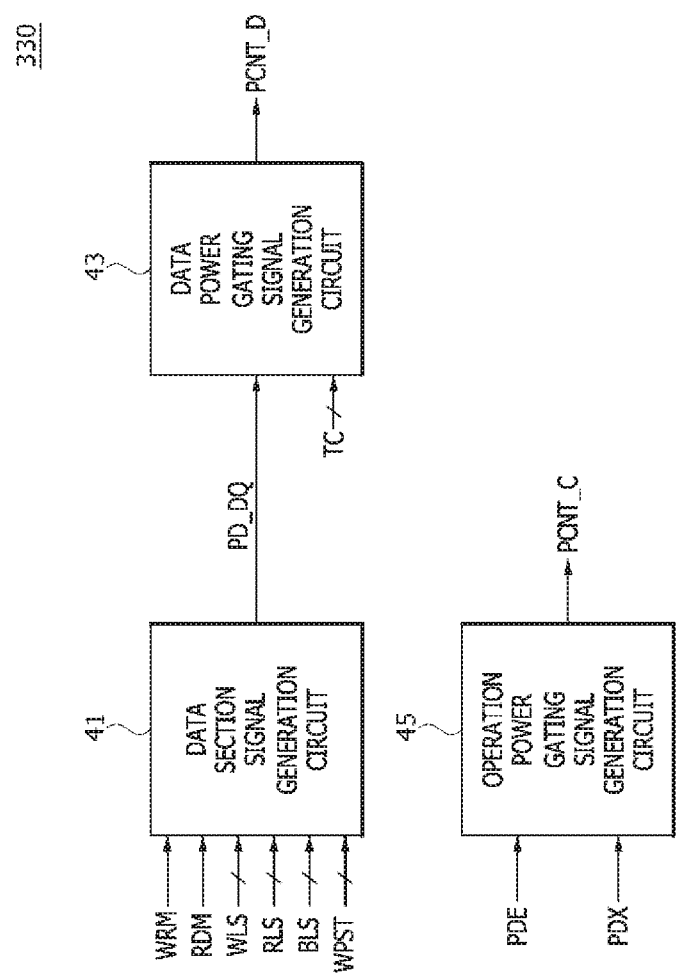
FIG. 13 is a block diagram, illustrating a configuration of a power gating control block, included in the semiconductor device that is illustrated in FIG. 12.

FIG. 13 is a block diagram, illustrating a configuration of the power gating control block 330. As illustrated in FIG. 13, the power gating control block 330 may include a data section signal generation circuit 41, a data power gating signal generation circuit 43, and an operation power gating signal generation circuit 45.

The data section signal generation circuit 41 may generate a data period signal PD_DQ based on the write mode signal WRM, the read mode signal RDM, the write latency signal WLS, the read latency signal RLS, the burst length signal BLS, and the write preamble signal WPST. The data section signal generation circuit 41 may generate the data period signal PD_DQ that is activated during a period that is set by the write latency, the burst length, and the write preamble period, from a point in time in which the write mode signal WRM activated for the write mode is inputted to the data section signal generation circuit 41. The data section signal generation circuit 41 may generate the data period signal PD_DQ that is activated during a period that is set by the read latency and the burst length, from a point in time in which the read mode signal RDM is generated for the read mode. The logic level of the data period signal PD_DQ that is activated may be set to have a logic "low" level or a logic "high" level according to the embodiments.

The data power gating signal generation circuit 43 may generate the data power control signal PCNT_D based on the data period signal PD_DQ and the target code TC. The data power gating signal generation circuit 43 may activate the data power control signal PCNT_D to drive the data power signal PS_D during a period that is set by the target code TC, from a point in time in which the data period signal PD_DQ is activated.

The operation power gating signal generation circuit 45 may generate the operation power control signal PCNT_C based on the power-down mode entry signal PDE and the power-down mode exit signal PDX. The operation power gating signal generation circuit 45 may deactivate the operation power control signal PCNT_C to inhibit the operation power signal PS_C from being driven during the power-down mode (i.e., during a period from a point in time in which the power-down mode begins till a point in time in which the power-down mode terminates).

Figure 14:
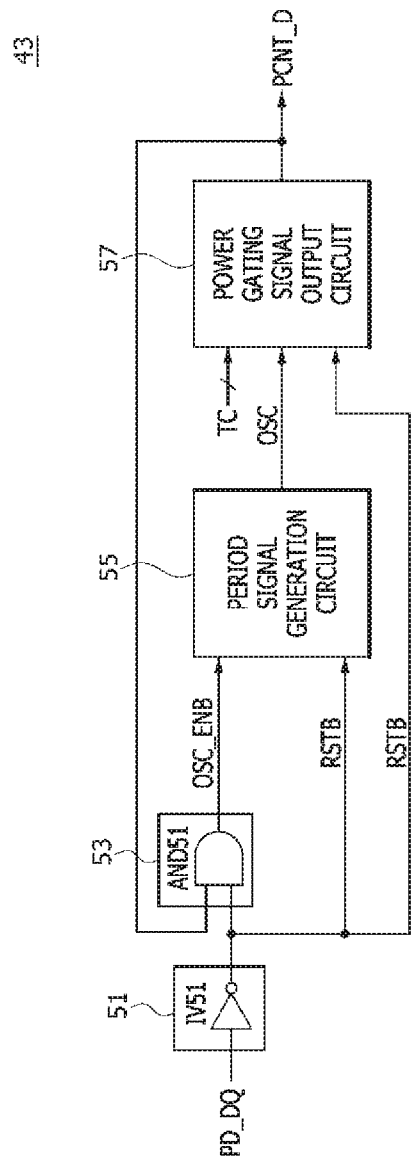
FIG. 14 illustrates an example of a data power gating signal generation circuit, included in the power gating control block that is illustrated in FIG. 13.

FIG. 14 illustrates a configuration of the data power gating signal generation circuit 43 that is included in the power gating control block 330. As illustrated in FIG. 14, the data power gating signal generation circuit 43 may include a reset signal generation circuit 51, an oscillation signal generation control circuit 53, a periodic signal generation circuit 55, and a power gating signal output circuit 57.

The reset signal generation circuit 51 may include an inverter IV51 and may inversely buffer the data period signal PD_DQ to generate a reset signal RSTB. The reset signal RSTB may be activated to a logic "low" level when the data period signal PD_DQ is activated to a logic "high" level in the write mode or the read mode.

The oscillation signal generation control circuit 53 may include an AND gate AND51 and may perform a logical AND operation of an output signal of the inverter IV51 and the data power control signal PCNT_D to generate an oscillation signal generation control signal OSC_ENB. The oscillation signal generation control signal OSC_ENB may be activated to a logic "low" level when the data period signal PD_DQ is activated to a logic "high" level.

The periodic signal generation circuit 55 may generate an oscillation signal OSC based on the reset signal RSTB and the oscillation signal generation control signal OSC_ENB. The periodic signal generation circuit 55 may reset the oscillation signal OSC when the reset signal RSTB is activated to a logic "low" level. The periodic signal generation circuit 55 may generate the oscillation signal OSC while the reset signal RSTB is deactivated to a logic "high" level and the oscillation signal generation control signal OSC_ENB is generated to a logic "low" level. A cycle time of the oscillation signal OSC may be set to be different according to the embodiments.

The power gating signal output circuit 57 may generate the data power control signal PCNT_D based on the reset signal RSTB, the oscillation signal OSC, and the target code TC. The power gating signal output circuit 57 may reset the data power control signal PCNT_D when the reset signal RSTB is activated to a logic "low" level. The power gating signal output circuit 57 may activate the data power control signal PCNT_D during a period that is necessary for counting the oscillation signal OSC by the number of times that is set by the target code TC.

Figure 15:
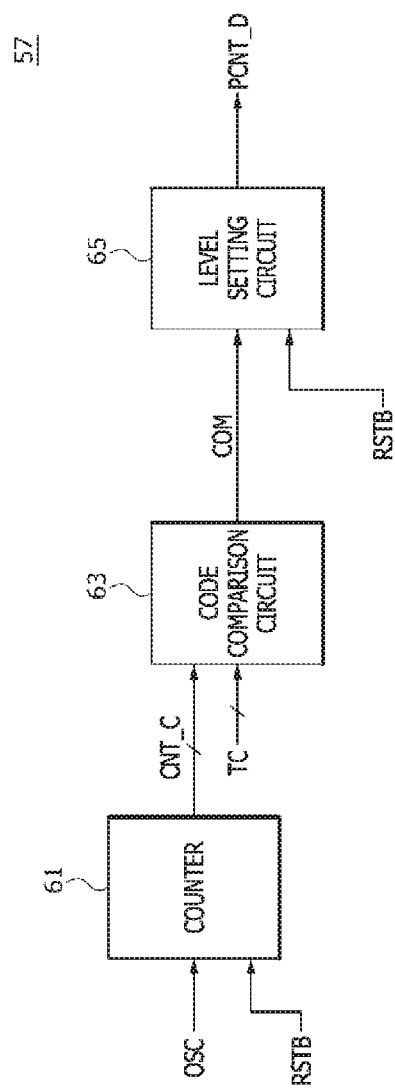
FIG. 15 is a block diagram, illustrating a configuration of a power gating signal generation circuit, included in the data power gating signal generation circuit that is illustrated in FIG. 14.

FIG. 15 is a block diagram, illustrating a configuration of the power gating signal output circuit 57, included in the data power gating signal generation circuit 43. As illustrated in FIG. 15, the power gating signal output circuit 57 may include a counter 61, a code comparison circuit 63, and a level setting circuit 65.

The counter 61 may generate a counted code CNT_C based on the reset signal RSTB and the oscillation signal OSC. The counter 61 may reset the counted code CNT_C when the reset signal RSTB is activated to a logic "low" level. The counter 61 may count the oscillation signal OSC to generate the counted code CNT_C when the reset signal RSTB is deactivated to a logic "high" level. The counter 61 may generate the counted code CNT_C including bits with signals that have a logic level combination that corresponds to the number of times that the oscillation signal OSC is counted. The counter 61 may count the oscillation signal OSC in synchronization with a rising edge that corresponds to a point in time in which a logic level of the oscillation signal OSC changes from a logic "low" level to a logic "high" level or a falling edge corresponding to a point in time in which a logic level of the oscillation signal OSC changes from a logic "high" level to a logic "low" level.

The code comparison circuit 63 may compare the counted code CNT_C with the target code TC to generate a comparison signal COM. The code comparison circuit 63 may generate the comparison signal COM having a first logic level when the counted code CNT_C is different from the target code TC and may generate the comparison signal COM having a second logic level when the counted code CNT_C is the same as the target code TC. In the present embodiment, the first logic level may be set to be a logic "low" level, and the second logic level may be set to be a logic "high" level.

The level setting circuit 65 may generate the data power control signal PCNT_D based on the reset signal RSTB and the comparison signal COM. The level setting circuit 65 may generate the data power control signal PCNT_D having the first logic level at a point in time in which a logic level of the reset signal RSTB changes from a logic "high" level to a logic "low" level. The level setting circuit 65 may set the data power control signal PCNT_D to the second logic level when the comparison signal COM has the second logic level.

Figure 16:
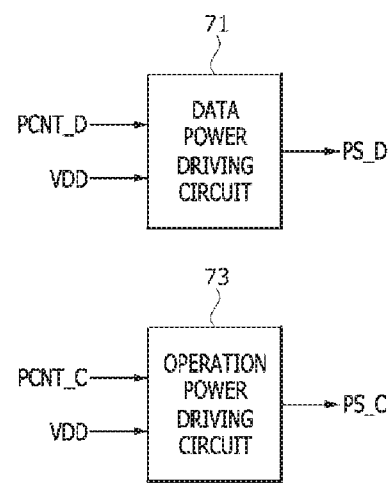
FIG. 16 is a block diagram, illustrating a configuration of a power gating circuit, included in the semiconductor device that is illustrated in FIG. 12.

FIG. 16 is a block diagram, illustrating a configuration of the power gating circuit 350. As illustrated in FIG. 16, the power gating circuit 350 may include a data power driving circuit 71 and an operation power driving circuit 73, The data power driving circuit 71 may drive the data power signal PS_D by using the power source voltage VDD when the data power control signal PCNT_D is activated. The operation power driving circuit 73 may drive the operation power signal PS_C by using the power source voltage VDD when the operation power control signal PCNT_C is activated.

Figure 17:
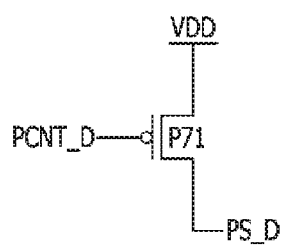
FIG. 17 is a circuit diagram, illustrating a configuration of a data power driving circuit, included in the power gating circuit that is illustrated in FIG. 16.

FIG. 17 is a circuit diagram, illustrating a configuration of the data power driving circuit 71. As illustrated in FIG. 17, the data power driving circuit 71 may be electrically coupled between a supply terminal of the power source voltage VDD and a supply terminal of the data power signal PS_D and may be designed to include a PMOS transistor P71 that functions as a power switch based on the data power control signal PCNT_D. The data power driving circuit 71 may drive the data power signal PS_D to the power source voltage VDD by using the PMOS transistor P71 which is turned on when the data power control signal PCNT_D may be activated to a logic "low" level.

Figure 18:
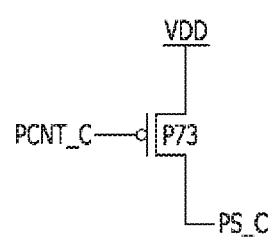
FIG. 18 is a circuit diagram, illustrating a configuration of an operation power driving circuit, included in the power gating circuit that is illustrated in FIG. 16.

FIG. 18 is a circuit diagram, illustrating a configuration of the operation power driving circuit 73. As illustrated in FIG. 18, the operation power driving circuit 73 may be electrically coupled between the supply terminal of the power source voltage VDD and a supply terminal of the operation power signal PS_C and may be designed to include a PMOS transistor P73 that functions as a power switch based on the operation power control signal PCNT_C. The operation power driving circuit 73 may drive the operation power signal PS_C to the power source voltage VDD by using the PMOS transistor P73 which is turned on when the operation power control signal PCNT_C is activated to a logic "low" level.

Figure 19:
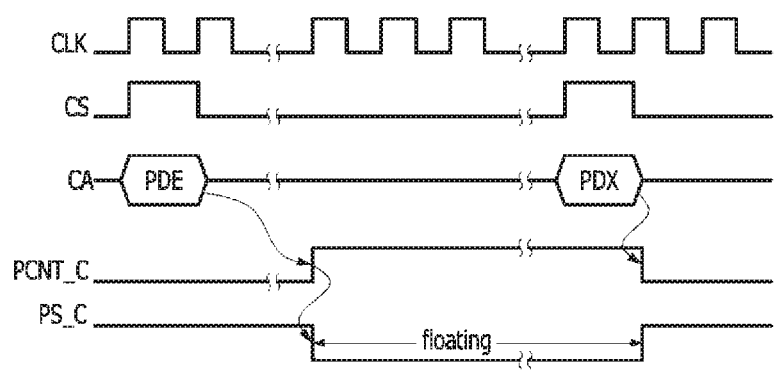
FIG. 19 is a timing diagram, illustrating an operation that generates an operation power signal when the semiconductor device, illustrated in FIG. 12, enters a write mode.

FIG. 19 is a timing diagram, illustrating an operation that generates the operation power control signal PCNT_C when the semiconductor device 3 enters the write mode.

As illustrated in FIG. 19, when the power-down mode entry signal PDE and the power-down mode exit signal PDX are inputted based on the command/address signal CA while the chip selection signal CS is generated to have a logic "high" level in synchronization with the clock signal CLK, the operation power control signal PCNT_C may be deactivated to a logic "high" level during the power-down mode. In the power-down mode, the operation power control signal PCNT_C may be deactivated to a logic "high" level, and the operation power signal PS_C maintains a floating state to inhibit the operation power signal PS_C from being driven to the power source voltage VDD. Accordingly, the operation power signal PS_C, which is supplied to the internal operation control block 390, may maintain the floating state during the power-down mode to reduce power consumption of the semiconductor device 3.

Figure 20:
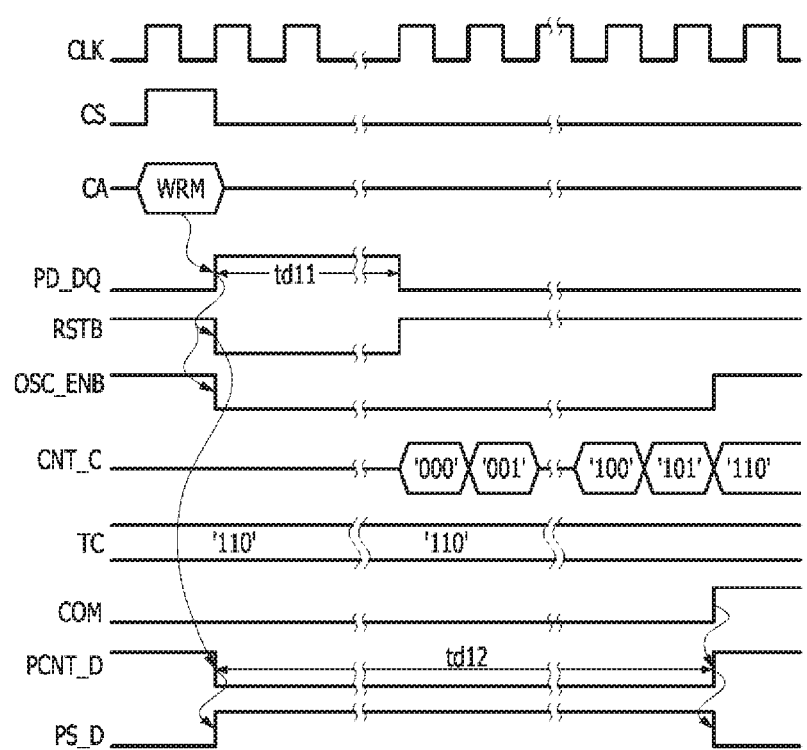
FIG. 20 is a timing diagram, illustrating an operation that generates a data power signal when the semiconductor device, illustrated in FIG. 12, enters a write mode.

FIG. 20 is a timing diagram, illustrating an operation in which the data power control signal PCNT_D is generated when the semiconductor device 3 enters the write mode.

As illustrated in FIG. 20, when the write mode signal WRM is activated to a logic "high" level based on the command/address signal CA while the chip selection signal CS is generated to have a logic "high" level in synchronization with the clock signal CLK, the data period signal PD_DQ may be activated to a logic "high" level during a period "td11". The period "td11" during which the data period signal PD_DQ is activated may be set by the write latency, the burst length, and the write preamble period. When the data period signal PD_DQ is activated to a logic "high" level, the oscillation signal OSC, the counted code CNT_C, and the data power control signal PCNT_D may be reset by the reset signal RSTB which is activated to a logic "low" level. After the period "td11" elapses, a counting operation may be performed by the reset signal RSTB deactivated to a logic "high" level and the oscillation signal generation control signal OSC_ENB activated to a logic "low" level so that a logic level combination of the counted code CNT_C may sequentially change. When the counted code CNT_C has the same logic level combination as the target code TC, the logic level of the comparison signal COM may change from a logic "low" level to a logic "high" level. The data power control signal PCNT_D may be activated to a logic "low" level during a period "td12" from a point in time in which the data period signal PD_DQ is activated to a logic "high" level till a point in time in which the comparison signal COM is generated to have a logic "high" level. Because the data power signal PS_D supplied to the data input/output block 370 is driven only during a period that the data DATA is inputted, it may be possible to reduce power consumption of the semiconductor device 3 while the data DATA is not inputted even though the semiconductor device 3 is out of the power-down mode. In addition, a period during which the data power signal PS_D is supplied may be adjusted by the target code TC. Thus, when the semiconductor device 3 successively enters the write mode, it may be possible to prevent a power switch driving the data power signal PS_D from being repeatedly turned on and off. Accordingly, the power consumption of the semiconductor device 3 may be reduced.

Figure 21:
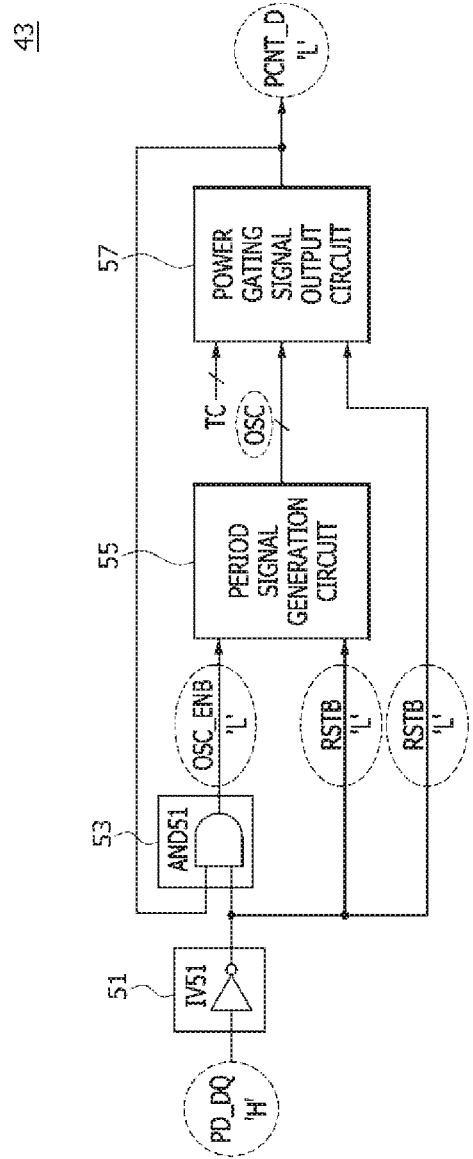
FIGS. 21 to 23 illustrates an operation that generates a data power control signal by using the data power gating signal generation circuit that is illustrated in FIG. 14.
Figure 22:
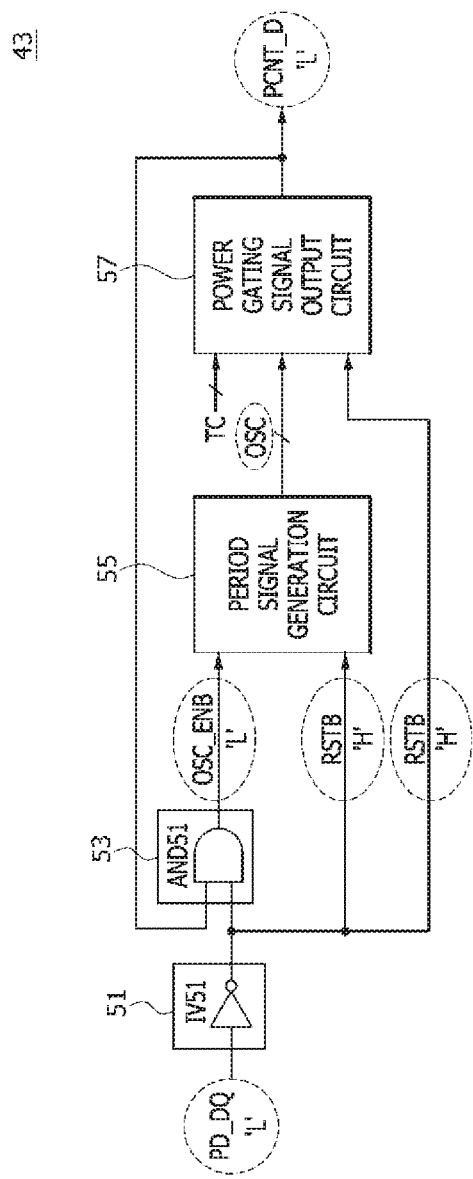
Figure 23:
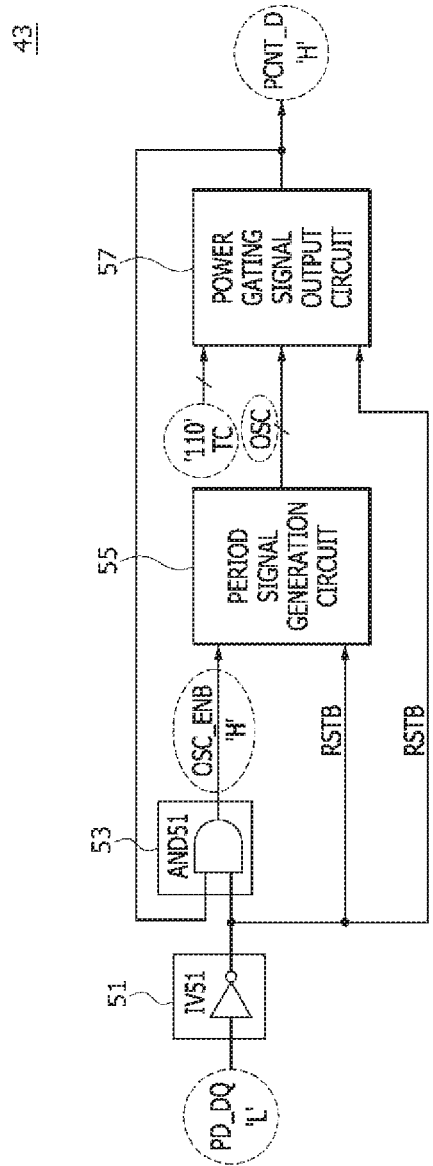

FIGS. 21 to 23 illustrates an operation that generates the data power control signal PCNT_D by using the data power gating signal generation circuit 43.

As illustrated in FIG. 21, when the data period signal PD_DQ is activated to a logic "high(H)" level in the write mode, the reset signal RSTB and the oscillation signal generation control signal OSC_ENB may be set to have a logic "low(L)" level. The oscillation signal OSC generated by the periodic signal generation circuit 55 and the data power control signal PCNT_D generated by the power gating signal output circuit 57 may be reset when the reset signal RSTB is activated to a logic "low(L)" level.

As illustrated in FIG. 22, the power gating signal output circuit 57 may count the oscillation signal OSC generated by the periodic signal generation circuit 55 while the reset signal RSTB is set to have a logic "high(H)" level and the oscillation signal generation control signal OSC_ENB is set to have a logic "low(L)" level. Even though the data period signal PD_DQ is deactivated to a logic "low(L)" level, the oscillation signal generation control signal OSC_ENB may maintain an activated state having a logic "low(L)" level by the data power control signal PCNT_D which is reset to have a logic "low(L)" level. The number of times that the oscillation signal OSC is counted by the power gating signal output circuit 57 may be set by the target code TC.

As illustrated in FIG. 23, when the number of times that the oscillation signal OSC is counted by the power gating signal output circuit 57 is equal to the number of times that is set by the target code TC, the power gating signal output circuit 57 may generate the data power control signal PCNT_D, which is activated to a logic "high(H)" level. The number of times, which is set by the target code TC, may be set by a logic level combination (e.g., '110') of bit signals that is included in the target code TC. Because the oscillation signal generation control signal OSC_ENB is deactivated by the data power control signal PCNT_D to have a logic "high(H)" level, the periodic signal generation circuit 55 may stop generating the oscillation signal OSC.

As described above, the data power control signal PCNT_D may be activated to a logic "high(H)" level to drive the data power signal PS_D during a period that is set by the target code TC, from a point in time in which the data period signal PD_DQ is activated to a logic "high(H)" level.

Figure 24:
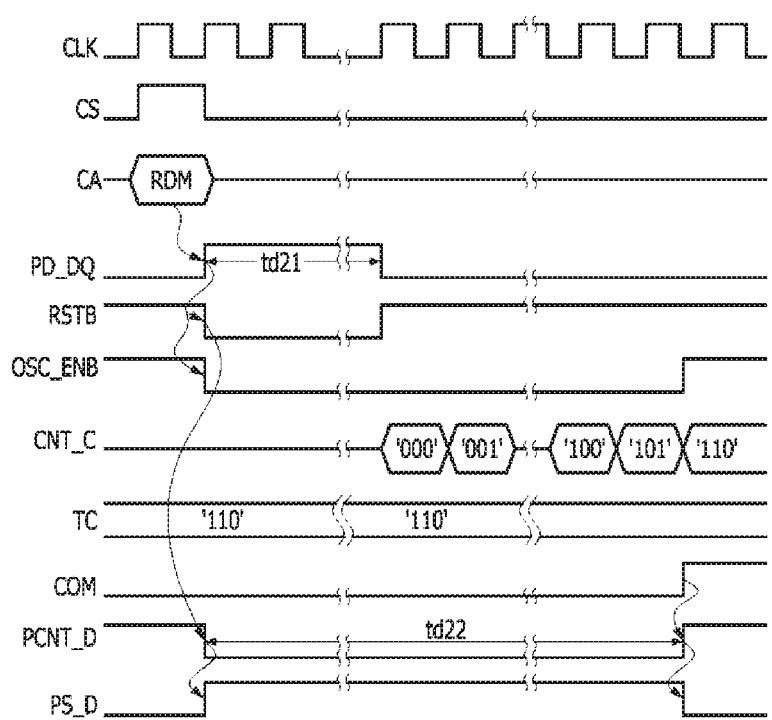
FIG. 24 is a timing diagram, illustrating an operation that generates a data power control signal when the semiconductor device, illustrated in FIG. 12, enters a read mode.

FIG. 24 is a timing diagram, illustrating an operation in which the data power control signal PCNT_D is generated when the semiconductor device 3 enters the read mode.

As illustrated in FIG. 24, when the read mode signal RDM is activated to a logic "high" level based on the command/address signal CA while the chip selection signal CS is generated to have a logic "high" level in synchronization with the clock signal CLK, the data period signal PD_DQ may be activated to a logic "high" level during a period "td21". The period "td21" during which the data period signal PD_DQ is activated may be set by the read latency and the burst length. When the data period signal PD_DQ is activated to a logic "high" level, the oscillation signal OSC, the counted code CNT_C, and the data power control signal PCNT_D may be reset by the reset signal RSTB, which is activated to a logic "low" level. After the period "td21" elapses, a counting operation may be performed by the reset signal RSTB that is deactivated to a logic "high" level and the oscillation signal generation control signal OSC_ENB that is activated to a logic "low" level so that a logic level combination of the counted code CNT_C may sequentially change. When the counted code CNT_C has the same logic level combination as the target code TC, the logic level of the comparison signal COM may change from a logic "low" level to a logic "high" level. The data power control signal PCNT_D may be activated to a logic "low" level during a period "td22" from a point in time in which the data period signal PD_DQ is activated to a logic "high" level till a point in time in which the comparison signal COM is generated to have a logic "high" level. Because the data power signal PS_D supplied to the data input/output block 370 is driven only during a period that the data DATA is outputted, it may be possible to reduce the power consumption of the semiconductor device 3 while the data DATA is not outputted even though the semiconductor device 3 is out of the power-down mode. In addition, the period during which the data power signal PS_D is supplied may be adjusted by the target code TC. Thus, when the semiconductor device 3 successively enters the read mode, it may be possible to prevent a power switch driving the data power signal PS_D from being repeatedly turned on and off. Accordingly, the power consumption of the semiconductor device 3 may be reduced.

Figure 25:
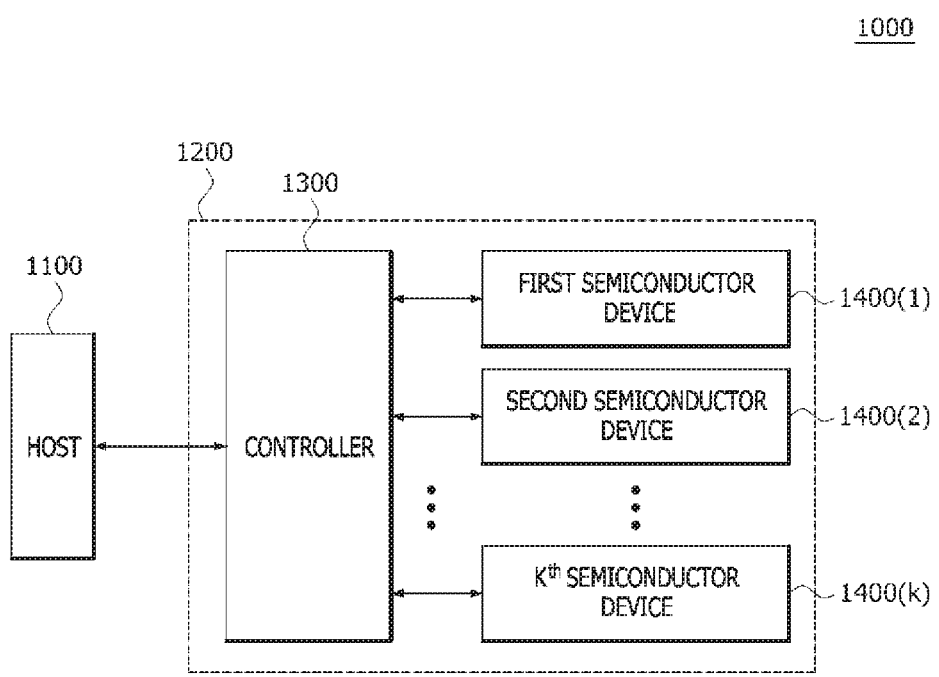
FIG. 25 is a block diagram, illustrating a configuration of an electronic system, according to an embodiment of the present disclosure.

FIG. 25 is a block diagram, illustrating a configuration of an electronic system 1000 according to an embodiment of the present disclosure. As illustrated in FIG. 25, the electronic system 1000 may include a host 1100 and a semiconductor system 1200. The semiconductor system 1200 may correspond to the semiconductor system 1 illustrated in FIG. 11.

The host 1100 and the semiconductor system 1200 may transmit signals to each other by using an interface protocol. The interface protocol used for communication between the host 1100 and the semiconductor system 1200 may include any one of various interface protocols such as a multi-media card (MMC), an enhanced small device interface (ESDI), an integrated drive electronics (IDE), a peripheral component interconnect-express (PCI-E), an advanced technology attachment (ATA), a serial ATA (SATA), a parallel ATA (DATA), a serial attached SCSI (SAS), and a universal serial bus (USB).

The semiconductor system 1200 may include a controller 1300 and semiconductor devices 1400(K:1). The controller 1300 may control the semiconductor devices 1400(K:1) such that each of the semiconductor devices 1400(K:1) inhibits an operation power signal from being supplied to the internal operation control block 390 in the power-down mode and supplies a data power signal to the data input/output block 370 only during a period that DATA is inputted or outputted. Each of the semiconductor devices 1400(K:1) may continuously supply the data power signal to the data input/output block 370 when successive input/output operations are performed in each of the semiconductor devices 1400(K:1), thereby preventing a power supply switch from being repeatedly turned on and off.

The controller 1300 may be realized using the controller 10 that is illustrated in FIG. 11. Each of the semiconductor devices 1400(K:1) may be realized using the semiconductor device 3 illustrated in FIGS. 11 and 12. In some embodiments, each of the semiconductor devices 1400(K:1) may be realized using any one of a dynamic random access memory (DRAM), a phase change random access memory (PRAM), a resistive random access memory (RRAM), a magnetic random access memory (MRAM), and a ferroelectric random access memory (FRAM).

While the present invention has been illustrated and described with respect to specific embodiments, these embodiments are not intended to be restrictive, but rather descriptive. Further, it is noted that the present invention may be achieved in various ways through substitution, change, and modification, as would be understood by those skilled in the art, without departing from the spirit and/or scope of the present invention as defined by the following claims.

What is claimed is:

1. A semiconductor device comprising:
    a power gating control block configured to activate a data power control signal during a period that is set by a target code, the period being from a point in time in which the semiconductor device enters a read mode or a write mode, and configured to deactivate an operation power control signal in a power-down mode; and
    a power gating circuit configured to inhibit a data power signal from being supplied to a data input/output block based on the data power control signal and configured to inhibit an operation power signal from being supplied to an internal operation control block based on the operation power control signal.

2. The semiconductor device of claim 1, wherein the power gating control block is configured to generate the data power control signal based on a write mode signal, a read mode signal, a write latency signal, a read latency signal, a burst length signal, a write preamble signal, and the target code.

3. The semiconductor device of claim 2, wherein the write preamble signal is a signal that corresponds to a write preamble period, which is set as a period in which a data input/output clock signal is inputted after data is inputted in the write mode.

4. The semiconductor device of claim 2, wherein the target code, the write latency signal, the read latency signal, and the burst length signal are extracted from a command/address signal and stored to a mode register in a mode register write mode.

5. The semiconductor device of claim 1, wherein the power gating control block includes:
    a data section signal generation circuit configured to generate a data period signal during another period that is set by a write latency, a burst length, and a write preamble period, the other period being from a point in time in which a write mode signal is generated; and
    a data power gating signal generation circuit configured to generate the data power control signal based on the data period signal and the target code.

6. The semiconductor device of claim 5, wherein the data power gating signal generation circuit includes:
    a periodic signal generation circuit configured to generate an oscillation signal based on the data period signal; and
    a power gating signal output circuit configured to count the oscillation signal by a certain number of times, the certain number of times being set by the target code, to generate the data power control signal.

7. The semiconductor device of claim 6, wherein the power gating signal output circuit includes:
    a counter configured to count the oscillation signal to generate a counted code;
    a code comparison circuit configured to compare the counted code with the target code to generate a comparison signal; and
    a level setting circuit configured to set a level of the data power control signal based on the comparison signal.

8. The semiconductor device of claim 1, wherein the power gating control block includes:
    a data section signal generation circuit configured to generate a data period signal during another period that is set by a read latency and a burst length, the other period being from a point in time in which a read mode signal is generated; and
    a data power gating signal generation circuit configured to generate the data power control signal based on the data period signal and the target code.

9. The semiconductor device of claim 1, wherein the power gating control block is configured to generate the operation power control signal based on a power-down mode entry signal and a power-down mode exit signal.

10. The semiconductor device of claim 1, wherein the power gating circuit includes:
    a data power driving circuit configured to drive the data power signal by using a power source voltage based on the data power control signal; and
    an operation power driving circuit configured to drive the operation power signal by using the power source voltage based on the operation power control signal.

11. A semiconductor device comprising:
    a power gating control block configured to generate a data power control signal based on a write mode signal, a read mode signal, a write latency signal, a read latency signal, a burst length signal, a write preamble signal, and a target code and configured to generate an operation power control signal based on a power-down mode entry signal and a power-down mode exit signal;
    a data power driving circuit configured to drive a data power signal based on the data power control signal; and
    an operation power driving circuit configured to drive an operation power signal based on the operation power control signal.

12. The semiconductor device of claim 11, wherein the target code, the write latency signal, the read latency signal, and the burst length signal are extracted from a command/address signal and stored in a mode register in a mode register write mode.

13. The semiconductor device of claim 11, wherein the power gating control block includes:
    a data section signal generation circuit configured to generate a data period signal during a period that is set by a write latency, a burst length, and a write preamble period, the period being from a point in time in which the write mode signal is generated; and
    a data power gating signal generation circuit configured to generate the data power control signal based on the data period signal and the target code.

14. The semiconductor device of claim 13, wherein the data power gating signal generation circuit includes:
    a periodic signal generation circuit configured to generate an oscillation signal based on the data period signal; and
    a power gating signal output circuit configured to count the oscillation signal by a certain number of times, the certain number of times being set by the target code, to generate the data power control signal.

15. The semiconductor device of claim 14, wherein the power gating signal output circuit includes:

a counter configured to count the oscillation signal to generate a counted code;

a code comparison circuit configured to compare the counted code with the target code to generate a comparison signal; and a level setting circuit configured to set a level of the data power control signal based on the comparison signal.

16. The semiconductor device of claim 11, wherein the power gating control block includes:

a data section signal generation circuit configured to generate a data period signal during a period that is set by a read latency and a burst length, the period being from a point in time in which the read mode signal is generated; and a data power gating signal generation circuit configured to generate the data power control signal based on the data period signal and the target code.

17. A semiconductor device comprising:

a data section signal generation circuit configured to activate a data period signal during a period that is set by a write latency, a burst length, and a write preamble period, the period being from a point in time in which a write mode signal is generated and configured to activate the data period signal during another period that is set by a read latency and the burst length, the other period being from a point in time in which a read mode signal is generated;

a data power gating signal generation circuit configured to generate a data power control signal based on the data period signal and a target code; and a data power driving circuit configured to inhibit a data power signal from being driven based on the data power control signal.

18. The semiconductor device of claim 17, wherein the target code, a write latency signal corresponding to the write latency, a read latency signal corresponding to the read latency, and a burst length signal corresponding to the burst length are extracted from a command/address signal and stored to a mode register in a mode register write mode.

19. The semiconductor device of claim 17, wherein the data power gating signal generation circuit includes:

a periodic signal generation circuit configured to generate an oscillation signal based on the data period signal; and a power gating signal output circuit configured to count the oscillation signal by a certain number of times, the certain number of times being set by the target code, to generate the data power control signal.

20. The semiconductor device of claim 19, wherein the power gating signal output circuit includes:

a counter configured to count the oscillation signal to generate a counted code;

a code comparison circuit configured to compare the counted code with the target code to generate a comparison signal; and a level setting circuit configured to set a level of the data power control signal based on the comparison signal.

\* \* \* \* \*